(12) United States Patent
Furumura et al.

(10) Patent No.: US 11,963,294 B2
(45) Date of Patent: Apr. 16, 2024

(54) MULTILAYER RESIN SUBSTRATE, AND METHOD OF MANUFACTURING MULTILAYER RESIN SUBSTRATE

(71) Applicant: Murata Manufacturing Co., Ltd., Nagaokakyo (JP)

(72) Inventors: Tomohiro Furumura, Nagaokakyo (JP); Shigeru Tago, Nagaokakyo (JP); Hirotaka Fujii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 202 days.

(21) Appl. No.: 17/368,900

(22) Filed: Jul. 7, 2021

(65) Prior Publication Data

US 2021/0337656 A1    Oct. 28, 2021

Related U.S. Application Data

(63) Continuation of application No. PCT/JP2020/004219, filed on Feb. 5, 2020.

(30) Foreign Application Priority Data

Feb. 5, 2019    (JP) ................. 2019-018669

(51) Int. Cl.
*H05K 1/02*    (2006.01)
*H05K 1/03*    (2006.01)
(Continued)

(52) U.S. Cl.
CPC ............ *H05K 1/028* (2013.01); *H05K 1/036* (2013.01); *H05K 3/0035* (2013.01);
(Continued)

(58) Field of Classification Search
CPC .... H05K 1/0277; H05K 1/0278; H05K 1/028; H05K 1/0281; H05K 1/0296;
(Continued)

(56) References Cited

U.S. PATENT DOCUMENTS

2002/0076903 A1    6/2002    Kondo et al.
2002/0170171 A1    11/2002   Miyazaki et al.
(Continued)

FOREIGN PATENT DOCUMENTS

JP    2002-335082 A    11/2002
JP    3407737 B2    3/2003
(Continued)

OTHER PUBLICATIONS

WO 2019/230524 A1 Translation (Year: 2023).*
Official Communication issued in International Patent Application No. PCT/JP2020/004219, dated Mar. 10, 2020.

*Primary Examiner* — Hoa C Nguyen
*Assistant Examiner* — John B Freal
(74) *Attorney, Agent, or Firm* — Keating & Bennett, LLP

(57) ABSTRACT

A multilayer resin substrate includes a base material including stacked resin layers including an opening resin layer, a conductor pattern, and an interlayer connection conductor. A concave portion is provided in the base material. The opening resin layer is closer to a first main surface than other resin layers. The concave portion includes a first opening portion provided by a cutting process from one surface of the opening resin layer, and another resin layer. The interlayer connection conductor is provided by filling a conductor in a second opening portion provided by a cutting process from an opposite surface of the opening resin layer. The end portion of the one surface of the first opening portion is not in contact with the conductor pattern.

10 Claims, 13 Drawing Sheets

(51) Int. Cl.
*H05K 3/00* (2006.01)
*H05K 3/46* (2006.01)

(52) U.S. Cl.
CPC ......... *H05K 3/4688* (2013.01); *H05K 3/4697* (2013.01); *H05K 2201/0112* (2013.01); *H05K 2201/0129* (2013.01); *H05K 2201/0141* (2013.01); *H05K 2203/107* (2013.01)

(58) Field of Classification Search
CPC .... H05K 1/0298; H05K 1/036; H05K 1/0393; H05K 1/11; H05K 1/115; H05K 1/118; H05K 1/14; H05K 1/141; H05K 1/142; H05K 1/144; H05K 1/147; H05K 1/148; H05K 1/189; H05K 2201/0112; H05K 2201/0129; H05K 2201/0137; H05K 2201/0141; H05K 2201/0191; H05K 2201/0195; H05K 2201/05
See application file for complete search history.

(56) References Cited

U.S. PATENT DOCUMENTS

| | | | |
|---|---|---|---|
| 2008/0049405 A1 | 2/2008 | Sahara et al. | |
| 2011/0198111 A1* | 8/2011 | Naganuma | H05K 3/4691 |
| | | | 174/254 |
| 2015/0319844 A1* | 11/2015 | Kim | H05K 1/028 |
| | | | 29/829 |

FOREIGN PATENT DOCUMENTS

| | | |
|---|---|---|
| JP | 2008-034589 A | 2/2008 |
| JP | 2016-122728 A | 7/2016 |
| WO | 2014/199886 A1 | 12/2014 |
| WO | WO-2019230524 A1 * 12/2019 | ........... H05K 1/0278 |

* cited by examiner

MULTILAYER RESIN SUBSTRATE, AND METHOD OF MANUFACTURING MULTILAYER RESIN SUBSTRATE

CROSS REFERENCE TO RELATED APPLICATIONS

This application claims the benefit of priority to Japanese Patent Application No. 2019-018669 filed on Feb. 5, 2019 and is a Continuation Application of PCT Application No. PCT/JP2020/004219 filed on Feb. 5, 2020. The entire contents of each application are hereby incorporated herein by reference.

BACKGROUND OF THE INVENTION

1. Field of the Invention

The present invention relates to a multilayer resin substrate that includes a base material including a plurality of resin layers stacked on each other and a concave portion, and a conductor pattern and an interlayer connection conductor that are provided on the base material, and relates to a method of manufacturing such a multilayer resin substrate.

2. Description of the Related Art

Conventionally, a multilayer resin substrate that includes a base material including a plurality of resin layers being stacked on each other, a conductor pattern provided on only one surface (one side) of a resin layer, and an interlayer connection conductor provided on a resin layer has been known (see, for example, Japanese Patent No. 3407737). The multilayer resin substrate disclosed in Japanese Patent No. 3407737 is formed by forming a conductor pattern on one surface of a resin layer, filling a conductor (interlayer connection conductor described below) in a through hole provided in a resin layer, and then heating and pressing a plurality of resin layers including the resin layers.

In contrast, in order to avoid a structure and other components that are placed around the multilayer resin substrate or in order to bend the multilayer resin substrate, the base material may include a concave portion (such as a cavity, for example) that is thinner than other portions.

The multilayer resin substrate including the concave portion is formed, for example, by forming an opening (a hole) in a portion of the resin layer before being stacked, the portion later becoming the concave portion, and stacking, heating, and pressing a plurality of resin layers including the resin layer including the opening. Generally, while a small opening (an opening for an interlayer connection conductor or an opening to become a concave portion after heating and pressing) to be formed in a resin layer is formed by a cutting process from an opposite surface (opposite to one surface on which a conductor pattern is provided) of the resin layer, a scattered piece (particularly, a resin of which the composition has changed, a carbide of a resin, or the like) of the resin layer during the cutting process is easily attached to a periphery of an opening in the opposite surface. In addition, generally, the bonding strength of the bonded surface between the resin layers to which the scattered piece is attached after heating and pressing is lower than the bonding strength of the bonded surface between the resin layers to which the scattered piece is not attached. This is because a condition of bonding resin layers is set assuming only bonding of the resin layers to which such a scattered piece is not attached or because the bonded surface between the resin layer to which the scattered piece is attached and the resin layer to which the scattered piece is not attached is a boundary surface between different materials. In addition, the bonding strength of the bonded surface between the surface of the resin layer to which the scattered piece is attached and the conductor pattern is significantly lower than the bonding strength of the bonded surface between the resin layers, and interlayer peeling (delamination) easily occurs on the bonded surface (the bonded surface between the surface of the resin layer to which the scattered piece is attached and the conductor pattern).

SUMMARY OF THE INVENTION

Preferred embodiments of the present invention provide multilayer resin substrates that each include a plurality of resin layers that are stacked and include a resin layer including a conductor pattern on only one surface (one side) and a resin layer including an opening for an interlayer connection conductor and an opening to become a concave portion after heating and pressing, each of the multilayer resin substrates being capable of significantly reducing or preventing interlayer peeling at the concave portion.

A multilayer resin substrate according to a preferred embodiment of the present invention includes a base material that includes a first main surface including a concave portion, and a plurality of resin layers including an opening resin layer, the plurality of resin layers being stacked on each other, a conductor pattern provided on only one surface of the plurality of resin layers, and an interlayer connection conductor provided on at least the opening resin layer, and a first opening portion is provided by a cut portion that is cut from the one surface, a second opening portion is provided by a cut portion that is cut from an opposite surface opposite to the one surface, the concave portion is defined by the first opening portion, the opening resin layer, and another resin layer different from the opening resin layer, the interlayer connection conductor is provided by a metal material in the second opening portion, the first opening portion includes an end portion on the one surface, and the end portion is not in contact with the conductor pattern.

In multilayer resin substrates according to preferred embodiments of the present invention that each include the plurality of resin layers of which only the one side (the one surface) includes a conductor pattern, the plurality of resin layers include an opening resin layer including a first opening portion to define a concave portion, and a second opening portion for an interlayer connection conductor. The plurality of opening portions (the first opening portion and the second opening portion) are generally provided by a cutting process from the same surface (an opposite surface of the resin layer on which a conductor pattern is not provided) of the resin layer mainly because a step (a step of reversing the resin layer) may be increased. In a case in which the first opening portion and the second opening portion are provided by a cutting process from the opposite surface of the opening resin layer, when the opposite surface of the opening resin layer is bonded to the one surface of a different resin layer, an end portion (a portion to which a large number of scattered pieces are attached) of the opposite surface of the first opening portion may contact a conductor pattern provided on the different resin layer. In the base material after heating and pressing, the bonding strength of the bonded surface between the resin layers to which the scattered piece is attached is lower than the bonding strength of the bonded surface between the resin layers to which the scattered piece is not attached. In addition, the bonding strength of the bonded surface between the surface of the resin layer to which the scattered piece is attached and the conductor pattern is significantly lower than the bonding strength between the resin layer to which the scattered piece is not attached and the conductor pattern, and interlayer peeling easily occurs on such a bonded surface.

In contrast, according to the above-described configuration, the first opening portion is provided by a cutting process from the one surface, not from the opposite surface (a surface on which a cutting process is performed for the second opening portion for interlayer connection conductors) of the opening resin layer. Then, in the base material in which the plurality of resin layers of which the one surface includes the conductor pattern are stacked on each other, the end portion (a portion to which a large number of scattered pieces are attached) on the one surface of the first opening portion is not in contact with the conductor pattern. Therefore, in comparison with a case in which the end portion on the one surface of the first opening portion is in contact with the conductor pattern, the interlayer peeling of an inner periphery (a boundary between the opening resin layer and the different resin layer, in particular) of the concave portion is significantly reduced or prevented.

A method of manufacturing a multilayer resin substrate, the multilayer resin substrate including a base material including a first main surface including a concave portion, and the method according to a preferred embodiment of the present invention includes a conductor pattern forming step of forming a conductor pattern on only one surface of a plurality of resin layers including an opening resin layer, a first opening portion forming step of forming a first opening portion by a cutting process from the one surface of the opening resin layer, after the conductor pattern forming step, a second opening portion forming step of forming a second opening portion for interlayer connection, by a cutting process at least from an opposite surface of the opening resin layer, after the conductor pattern forming step, an interlayer conductor forming step of forming an interlayer connection conductor by filling a metal material in the second opening portion, after the second opening portion forming step, and a base material forming step of forming the base material by stacking, heating, and pressing the plurality of resin layers so as not to cause the conductor pattern to contact an end portion of the one surface of the first opening portion, and then configuring the concave portion by the first opening portion and another resin layer, after the first opening portion forming step and the interlayer conductor forming step.

According to this manufacturing method, the end portion (a portion to which a large number of scattered pieces are attached) on the one surface of the first opening portion is not in contact with the conductor pattern, so that the multilayer resin substrate in which the interlayer peeling at the concave portion is significantly reduced or prevented is able to be easily obtained.

According to preferred embodiments of the present invention, multilayer resin substrates each including a plurality of resin layers including a resin layer that are stacked and include a conductor pattern on only one surface (one side) and a resin layer including an opening for an interlayer connection conductor and an opening to become a concave portion after heating and pressing, each of the multilayer resin substrate being capable of significantly reducing or preventing interlayer peeling at the concave portion, are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
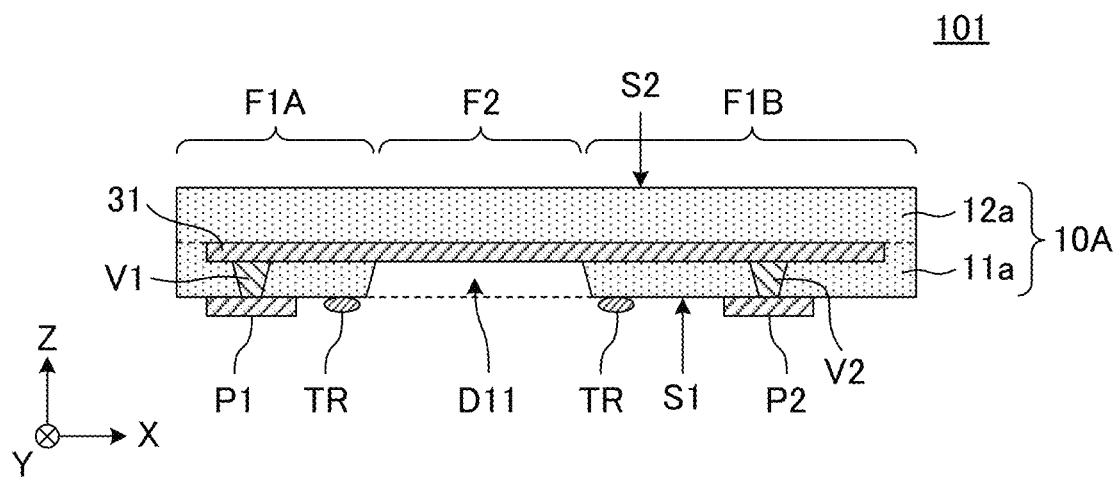
FIG. 1A is a cross-sectional view of a multilayer resin substrate 101 according to a first preferred embodiment of the present invention.

Hereinafter, preferred embodiments of the present invention will be described in detail with reference to the attached drawings and several specific examples. In the drawings, components and elements assigned with the same reference numerals or symbols will represent identical or substantially identical components and elements. While preferred embodiments of the present invention are divided and described for the sake of convenience in consideration of ease of description or understanding of main points, elements described in different preferred embodiments are able to be partially replaced and combined with each other. In the second and subsequent preferred embodiments, a description of matters common to the first preferred embodiment will be omitted and only different points will be described. In particular, the same advantageous functions and effects by the same or similar configurations will not be described one by one for each preferred embodiment.

First Preferred Embodiment

Figure 1B:
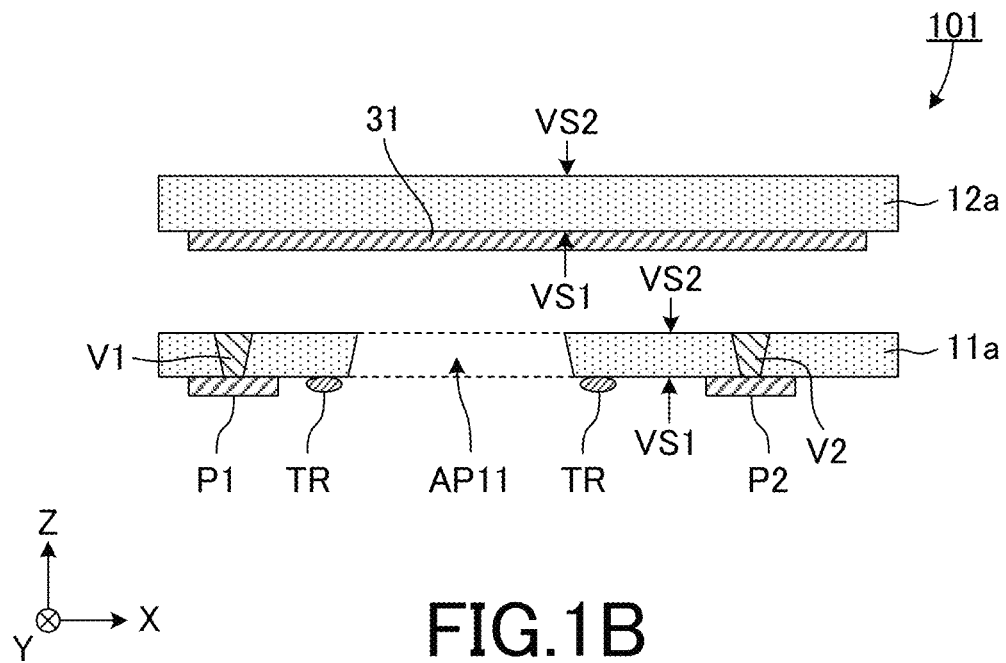
FIG. 1B is an exploded cross-sectional view of the multilayer resin substrate 101.

FIG. 1A is a cross-sectional view of a multilayer resin substrate 101 according to a first preferred embodiment of the present invention, and FIG. 1B is an exploded cross-sectional view of the multilayer resin substrate 101.

The multilayer resin substrate 101 includes a base material 10A, a conductor pattern 31, electrodes P1 and P2, and interlayer connection conductors V1 and V2.

The base material 10A is a flat plate made of, for example, a resin (a thermoplastic resin) and having a rectangular or substantially rectangular shape of which the longitudinal direction coincides with an X-axis direction. The base material 10A includes a first main surface S1, and a second main surface S2 being an opposite surface of the first main surface S1. A concave portion D11 of which the thickness (a thickness in a stacking direction in which a plurality of resin layers are stacked) in a Z-axis direction is smaller than a thickness of other portions is provided on the first main surface S1 of the base material 10A. Although not shown, the concave portion D11 according to the present preferred embodiment of the present invention is a groove provided in the entire or substantially the entire width direction (a Y-axis direction) of the base material 10A.

In addition, the base material 10A includes first regions F1A and F1B, and a second region F2. The first region F1A, the second region F2, and the first region F1B are disposed in this order in a positive X direction. As shown in FIG. 1A, the second region F2 is a portion of the base material 10A in which the concave portion D11 is provided. Since the thickness of the second region F2 is smaller than the thickness of the first regions F1A and F1B, the second region F2 is easier to deform than the first regions F1A and F1B, and has flexibility.

The base material 10A is a stacked body obtained by stacking a plurality of resin layers 11a and 12a that are made of, for example, a thermoplastic resin. The resin layers 11a and 12a are resin flat plates each having a rectangular or substantially rectangular shape of which the longitudinal direction coincides with the X-axis direction. The resin layers 11a and 12a include one surface VS1, and an opposite surface VS2 opposite to the one surface VS1. As will be described below, the one surface VS1 is a surface on which a conductor pattern is provided. The resin layers 11a and 12a are resin sheets made of a liquid crystal polymer (LCP) or a polyether ether ketone (PEEK), for example, as a main component.

In the present preferred embodiment, the resin layer 11a corresponds to an "opening resin layer". The opening resin layer (the resin layer 11a) is disposed closer to the first main surface S1 than other resin layers (i.e., the resin layer 12a).

Electrodes P1 and P2 are provided on a bottom surface (the one surface VS1 of the opening resin layer) of the resin layer 11a. The electrode P1 is a rectangular or substantially rectangular conductor pattern disposed near one end (a left end of the resin layer 11a in FIG. 1B) of the resin layer 11a. The electrode P2 is a rectangular or substantially rectangular conductor pattern disposed near the other end (a right end of the resin layer 11a in FIG. 1B) of the resin layer 11a. The surface roughness of a surface (a top surface of the electrodes P1 and P2 in FIG. 1B) in contact with the one surface VS1 of either of the electrodes P1 and P2 is larger than the surface roughness of the opposite surface (a bottom surface of the electrodes P1 and P2 in FIG. 1B). As a result, the bonding strength between the resin layer 11a and the electrodes P1 and P2 is increased. The electrodes P1 and P2 are conductor patterns made of, for example, Cu foil or similar foil.

In addition, interlayer connection conductors V1 and V2 are provided on the resin layer 11a. As will be described below, the interlayer connection conductors V1 and V2 are formed by filling a metal material in a second opening portion (not shown) formed by a cutting process from the top surface (the opposite surface VS2 of the opening resin layer) of the resin layer 11a. The second opening portion is a circular or substantially circular through hole formed by laser irradiation from the opposite surface VS2 of the opening resin layer, for example. The interlayer connection conductors V1 and V2 are provided in the second opening portion by providing (filling) conductive paste preferably including one or more of Cu, Sn, and the like or an alloy preferably including one or more of Cu, Sn, and the like, for example, and solidifying the conductive paste through the subsequent heating and pressing. It is to be noted that the present preferred embodiment is not limited to a case in which the entire second opening portion is filled with conductive paste. In other words, as will be described in a second preferred embodiment below, a case in which a portion of the second opening portion is formed of a filled plated via and a space of the second opening portion in which the filled plated via is not provided is filled with the conductive paste also corresponds to the filling. The interlayer connection conductors (the second opening portions) V1 and V2 have a truncated conical shape in which an area (an area of "a third opening of the second opening portion") of the one surface (the bottom surface of the resin layer 11a) VS1 of the opening resin layer is small and an area (an area of "a fourth opening of the second opening portion") of the opposite surface (the top surface of the resin layer 11a) VS2 of the opening resin layer is large. In addition, the second opening portion, in a plan view of the one surface VS1 (when viewed in the Z-axis direction), is provided at a position overlapping with the conductor pattern (the electrodes P1 and P2).

In addition, a first opening portion AP11 is provided in the resin layer 11a. The first opening portion AP11 is a rectangular or substantially rectangular through hole formed by a cutting process from the bottom surface (the one surface VS1 of the opening resin layer) of the resin layer 11a. The first opening portion AP11 is formed by laser irradiation from the one surface VS1 of the opening resin layer, for example. The first opening portion AP11 has a truncated conical shape in which an area (an area of "a first opening of the first opening portion") of the one surface (the bottom surface of the resin layer 11a) VS1 of the opening resin layer is large and an area (an area of "a second opening of the first opening portion") of the opposite surface (the top surface of the resin layer 11a) VS2 of the opening resin layer is small. The first opening portion AP11, when viewed in the Z-axis direction, is provided at a position not overlapping with the conductor pattern (the electrodes P1 and P2).

When the first opening portion AP11 is formed by laser irradiation, a scattered piece is easily attached to the one surface VS1 of the opening resin layer 11. A larger number of scattered pieces are attached to the one surface VS1 as closer to the end portion (a laser irradiated position) of the one surface VS1 of the first opening portion AP11 (see the scattered pieces TR in FIG. 1B). The scattered piece is such a piece that the resin material of the opening resin layer is evaporated or vaporized during laser irradiation and is attached to the one surface VS1 and may become a piece (a resin material of which the composition has changed, a carbide of a resin material, or the like, for example) of which the properties have changed by the laser irradiation.

In addition, the first opening portion AP11 may be formed by a cutting process with a drill or a similar tool from the one surface VS1 of the opening resin layer, for example. Further, when the first opening portion AP11 is formed by a cutting process with a drill or a similar tool, a scattered piece (a cut waste generated upon the cutting process with a drill) is easily attached to the one surface VS1 of the opening resin layer. A larger number of scattered pieces are attached to the one surface VS1 closer to the end portion of the one surface VS1 of the first opening portion AP11. In addition, the scattered piece may also become a piece of which the properties have changed from the resin material of the resin layer due to heat caused by cutting.

Herein, the "end portion of the one surface of the first opening portion," for example, is from an edge of the first opening portion in the one surface of the opening resin layer to a position separated from the edge of the first opening portion by a distance equal to the thickness of the first opening portion, when viewed in the Z-axis direction.

A conductor pattern 31 is provided on the bottom surface (the one surface VS1) of the resin layer 12a. The conductor pattern 31 is a linear conductor pattern extending in the X-axis direction (the transmission direction). The surface roughness of a surface (a top surface of the conductor pattern 31 in FIG. 1B) in contact with the one surface VS1 of the conductor pattern 31 is larger than the surface roughness of the opposite surface (a bottom surface of the conductor pattern 31 in FIG. 1B). As a result, the bonding strength between the resin layer 12a and the conductor pattern 31 is increased. The conductor pattern 31 is Cu foil, for example.

In the present preferred embodiment, the one surface VS1 of the resin layer (the opening resin layer) 11a is not in contact with the one surface VS1 of the different resin layer 12a. More specifically, as mainly shown in FIG. 1A, the opposite surface VS2 of the resin layer (the opening resin layer) 11a is bonded to the one surface VS1 of the other resin layer 12a. In addition, the electrode P1 is connected to one end of the conductor pattern 31 through the interlayer connection conductor V1. The other end of the conductor pattern 31 is connected to the electrode P2 through the interlayer connection conductor V2. The concave portion D11 is defined by the first opening portion AP11 provided in the resin layer 11a, and the resin layer 12a adjacent to the resin layer 11a.

As mainly shown in FIG. 1B, the conductor pattern (the conductor pattern 31 and the electrodes P1 and P2) is provided on only the one surface VS1 of the plurality of resin layers 11a and 12a. In addition, the end portion on the one surface VS1 (a surface of the resin layer 11a on which a cutting process is performed to form the first opening portion AP11) of the first opening portion AP11 is not in contact with the conductor pattern (the conductor pattern 31 and the electrodes P1 and P2).

Figure 2A:
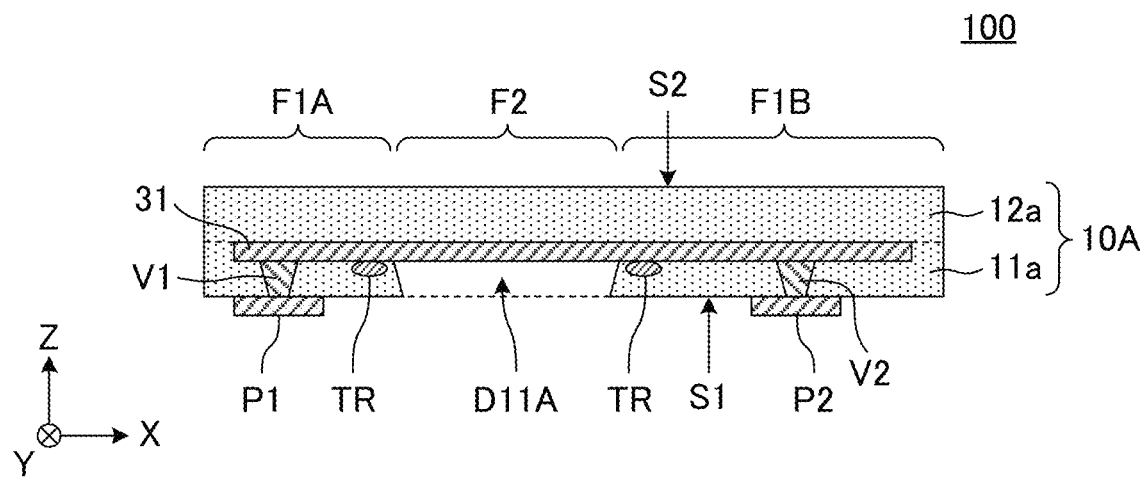
FIG. 2A is a cross-sectional view of a multilayer resin substrate 100 according to a comparative example.
Figure 2B:
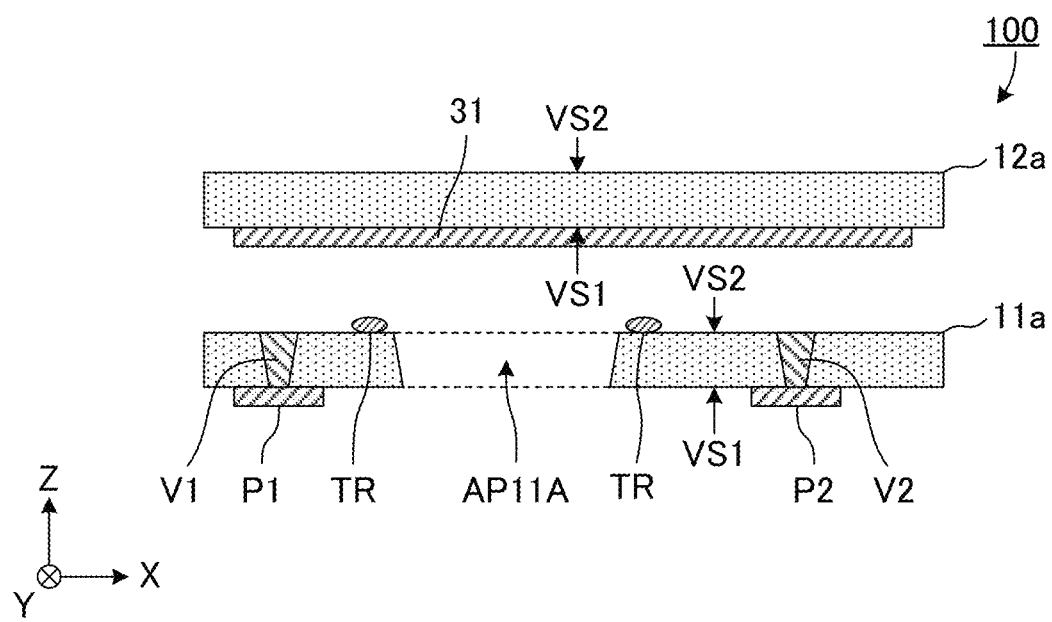
FIG. 2B is an exploded cross-sectional view of the multilayer resin substrate 100.

Subsequently, the advantages of the configuration in which the end portion on the one surface of the first opening portion is not in contact with the conductor pattern will be described with reference to a comparative example. FIG. 2A is a cross-sectional view of a multilayer resin substrate 100 according to a comparative example, and FIG. 2B is an exploded cross-sectional view of the multilayer resin substrate 100.

The multilayer resin substrate 100 according to the comparative example is different from the multilayer resin substrate 101 in that a concave portion D11A is provided in the first main surface S1 (a first opening portion AP11A is provided in the resin layer 11a). Other configurations of the multilayer resin substrate 100 are the same or substantially the same as the configurations of the multilayer resin substrate 101.

The concave portion D11A is defined by the first opening portion AP11A provided in the resin layer 11a, and the resin layer 12a adjacent to the resin layer 11a. It is to be noted that, as mainly shown in FIG. 1A, a bottom surface of the concave portion D11A is defined by the conductor pattern 31. However, the conductor pattern 31 is provided on the resin layer 12a, so that, in such a case as well, the concave portion D11A is able to be said to be configured by using the resin layer 12a. The first opening portion AP11A is a rectangular or substantially rectangular through hole formed by a cutting process (i.e., laser irradiation) from the top surface (the opposite surface VS2 of the opening resin layer) of the resin layer 11a. The first opening portion AP11A has a truncated conical shape in which an area of the opposite surface (the top surface of the resin layer 11a) VS2 of the opening resin layer is large and an area of the one surface (the bottom surface of the resin layer 11a) VS1 of the opening resin layer is small. It is to be noted that a larger number of scattered pieces are attached to the end portion of the opposite surface VS2 of the first opening portion AP11A (see the scattered pieces TR in FIG. 2B).

In the multilayer resin substrate 101 according to the present preferred embodiment to be formed by stacking the plurality of resin layers of which only the one side (the one surface) includes a conductor pattern, the plurality of resin layers 11a and 12a include the opening resin layer (the resin layer 11a) including the first opening portion AP11 to define the concave portion D11, and the second opening portion (not shown) for the interlayer connection conductors V1 and V2. The plurality of openings (the first opening portion AP11 and the second opening portion) are typically formed by a cutting process from the same surface (the opposite surface VS2 of the resin layer on which a conductor pattern is not provided) of the resin layer mainly because a step (a step of reversing the resin layer) may be increased.

As with the multilayer resin substrate 100 of the comparative example shown in FIGS. 2A and 2B, in a case in which the first opening portion AP11A and the second opening portion (not shown) are formed by a cutting process from the opposite surface VS2 of the opening resin layer (the resin layer 11a), when the opposite surface VS2 of the opening resin layer is bonded to the one surface VS1 of the other resin layer 12a, an end portion (a portion to which a large number of scattered pieces are attached) of the opposite surface VS2 of the first opening portion AP11A may contact the conductor pattern 31 provided on the different resin layer 12a. In the base material after heating and pressing, the bonding strength of the bonded surface between the resin layers to which the scattered piece is attached is lower than the bonding strength of the bonded surface between the resin layers to which the scattered piece is not attached. This is because a condition of bonding resin layers is set assuming only bonding of the resin layers to which such a scattered piece is not attached or because the bonded surface between the resin layer to which the scattered piece is attached and the resin layer to which the scattered piece is not attached is a boundary surface between different materials. In addition, the bonding strength of the bonded surface (the bonded surface between the top surface of the resin layer 11a and the conductor pattern 31 in FIG. 2A, for example) between the surface of the resin layer to which the scattered piece is attached and the conductor pattern is significantly lower than the bonding strength between the resin layer to which the scattered piece is not attached and the conductor pattern, and interlayer peeling easily occurs on such a bonded surface.

In contrast, the multilayer resin substrate 101 according to the present preferred embodiment achieves the following advantageous functions and effects.

(a) In the multilayer resin substrate 101 according to the present preferred embodiment, the first opening portion AP11 and the second opening portion (not shown) are each formed by a cutting process from respective different surfaces. In other words, the first opening portion AP11 is formed by a cutting process not from the opposite surface (a surface on which a cutting process is performed for the second opening portion for the interlayer connection conductors V1 and V2) VS2 of the opening resin layer, but from the one surface (a surface on which a conductor pattern is provided) VS1. Then, in the multilayer resin substrate 101, the end portion (a portion to which a large number of scattered pieces are attached) of the one surface VS1 of the opening AP11 is not in contact with the conductor pattern (the conductor pattern 31 and the electrodes P1 and P2). Particularly, in the present preferred embodiment, the one surface VS1 of the opening resin layer (the resin layer 11a) is not in contact with the one surface VS1 of the other resin layer 12a. With such a configuration, in comparison with the case in which the end portion on the one surface VS1 of the first opening portion is in contact with the conductor pattern (see the multilayer resin substrate 100 shown in FIG. 2B, for example), the interlayer peeling of an inner periphery (a boundary between the resin layers 11a and 12a, in particular) of the concave portion D11 is significantly reduced or prevented.

(b) In the multilayer resin substrate 101 according to the present preferred embodiment, the one surface VS1 of the opening resin layer (the resin layer 11a) is bonded to the opposite surface (a surface on which a conductor pattern is not provided) VS2 of the other resin layer 12a on which the conductor pattern 31 is provided. For example, in a case in which the one surface VS1 of the opening resin layer is bonded to the one surface VS1 of the different resin layer 12a, a scattered piece (particularly, a scattered piece TR attached to the end portion of the one surface VS1 of the first opening portion AP11) attached to the one surface VS1 of the opening resin layer when the first opening portion AP11 is formed and the conductor pattern 31 provided on the one surface VS1 of the resin layer 12a are brought into contact with each other, so that a change in the electrical characteristics of the multilayer resin substrate may occur. In contrast, according to the above configuration, the one surface VS1 of the opening resin layer is not bonded to the one surface VS1 of the different resin layer, so that the scattered piece does not directly contact the conductor pattern 31 of the other resin layer 12a, and the change in the electrical characteristics is significantly reduced or prevented.

It is to be noted that, when the second opening portion for the interlayer connection conductors V1 and V2 is formed by a cutting process from the one surface VS1 of the opening resin layer (the resin layer 11a), a scattered piece is easily attached to the end portion of the one surface VS1 of the second opening portion. However, the bonding strength between the interlayer connection conductors V1 and V2 and another conductor (the conductor pattern 31) is much higher than the bonding strength between the end portion of the one surface VS1 of the first opening portion AP11 and the conductor pattern. Therefore, on the bonded surface of the end portion of the one surface VS1 of the second opening portion, interlayer peeling is difficult to occur in comparison with the bonded surface of the end portion of the one surface VS1 of the first opening portion AP11. In addition, an area (an opening area) of the second opening portion viewed in the Z-axis direction is smaller than an area (an opening area) of the first opening portion AP11 viewed in the Z-axis direction, so that the quantity of scattered pieces to be attached to the end portion of the one surface VS1 of the second opening portion is smaller than the quantity of scattered pieces to be attached to the end portion of the one surface VS1 of the first opening portion AP11.

(c) In the multilayer resin substrate 101, the plurality of resin layers 11a and 12a are made of, for example, a thermoplastic resin. According to this configuration, as will be described below, a base material 10A is able to be easily formed by heating and pressing (collectively pressing) the stacked resin layers 11a and 12a. Therefore, the number of steps of manufacturing the multilayer resin substrate 101 is reduced, and the cost is able to be reduced to a low level. In addition, with this configuration, a multilayer resin substrate capable of being easier to plastically deform and maintaining (holding) a desired shape is able to be obtained.

(d) In the multilayer resin substrate 101, the conductor pattern 31 provided on the one surface VS1 of the resin layer 12a is bonded to the opposite surface VS2 of the resin layer (the opening resin layer) 11a, and is connected to the interlayer connection conductors V1 and V2 provided on the resin layer 11a. In addition, each of the interlayer connection conductors V1 and V2, when viewed in the Z-axis direction, is entirely or substantially entirely overlapped with the conductor pattern 31 and the electrodes P1 and P2. In a case in which a plurality of interlayer connection conductors are connected in the stacking direction (the Z-axis direction), conduction failure may easily occur due to a positional shift during stacking or a similar occasion. In contrast, according to this configuration, the plurality of interlayer connection conductors are not configured to be continuously connected to each other in the stacking direction, so that conduction failure due to a positional shift during stacking or a similar occasion is able to be significantly reduced or prevented.

(e) In the multilayer resin substrate 101, the conductor pattern (the electrodes P1 and P2) is provided on the one surface VS1 of second opening portions AP21 and AP22. In other words, the one surface VS1 of the second opening portions AP21 and AP22 is covered with the conductor pattern (the electrodes P1 and P2). According to this configuration, the conductive paste provided (filled) in the second opening portions AP21 and AP22 is able to be easily held. In addition, according to this configuration, the conductive paste, when being solidified by the subsequent heating and pressing, is easily connected electrically to the conductor pattern provided on the one surface VS1.

(f) In the multilayer resin substrate 101, the second opening portions (not shown) have a truncated conical shape in which an area of the one surface (the bottom surface of the resin layer 11a) VS1 of the opening resin layer is small and an area of the opposite surface (the top surface of the resin layer 11a) VS2 of the opening resin layer is large. According to this configuration, the second opening portions have a truncated conical shape tapered toward the one surface VS1, so that it is easy to fill with conductive paste. In addition, since the second opening portions have a truncated conical shape, in comparison with a case in which the second opening portions have a cylindrical or substantially cylindrical shape, the interlayer connection conductors V1 and V2 are able to be formed with a small amount of conductive paste, and the cost is able to be reduced.

(g) In the multilayer resin substrate 101, the first opening portion AP11 having a truncated conical shape of which the area on the opposite surface VS2 is smaller than the area of the one surface VS1 is configured to be provided in the opening resin layer (the resin layer 11a), and the opposite surface VS2 of the opening resin layer is configured to be bonded to the other resin layer 12a. According to this configuration, in comparison with a case in which the one surface VS1 of the opening resin layer is bonded to the other resin layer 12a, a bonded area between the opening resin layer and the other resin layer is able to be increased, so that the bonding strength between the opening resin layer and the other resin layer is increased. Therefore, in comparison with the case in which the one surface VS1 of the opening resin layer is bonded to the other resin layer 12a, interlayer peeling of the opening resin layer and the other resin layer 12a is significantly reduced or prevented.

Figure 3:
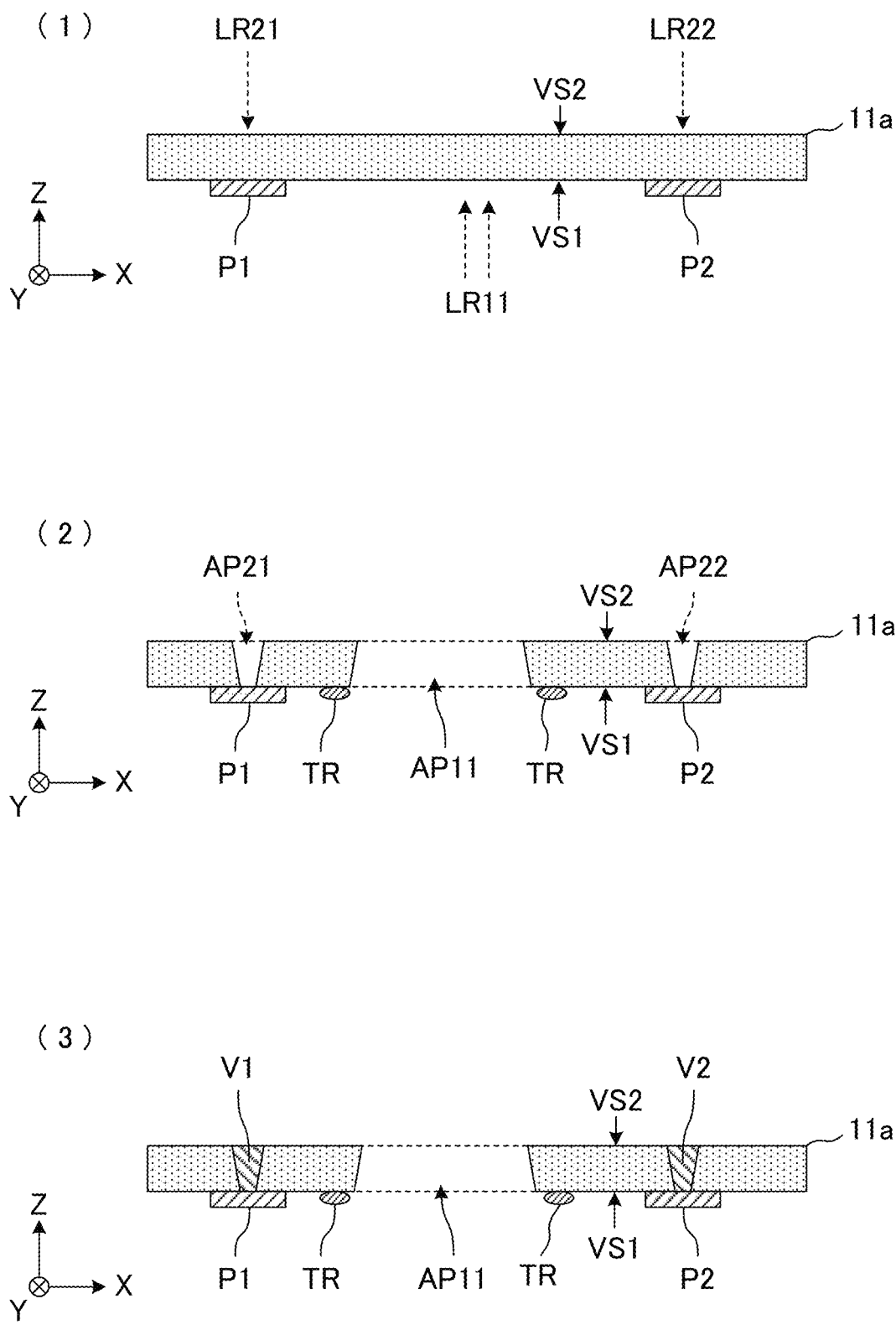
FIG. 3 is a cross-sectional view sequentially showing steps of manufacturing a resin layer 11a before stacking.
Figure 4:
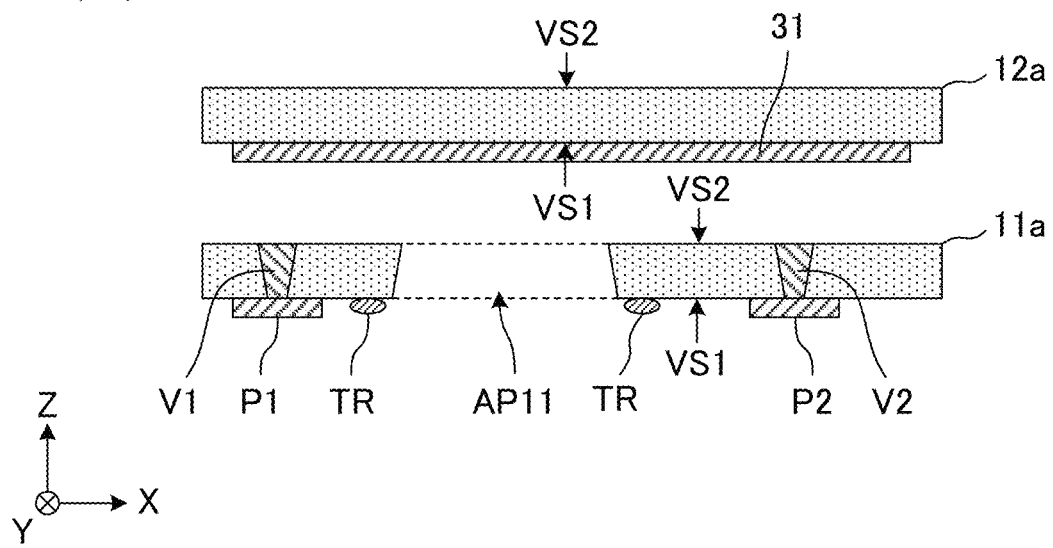
FIG. 4 is a cross-sectional view sequentially showing steps of manufacturing the multilayer resin substrate 101.
Figure 4:
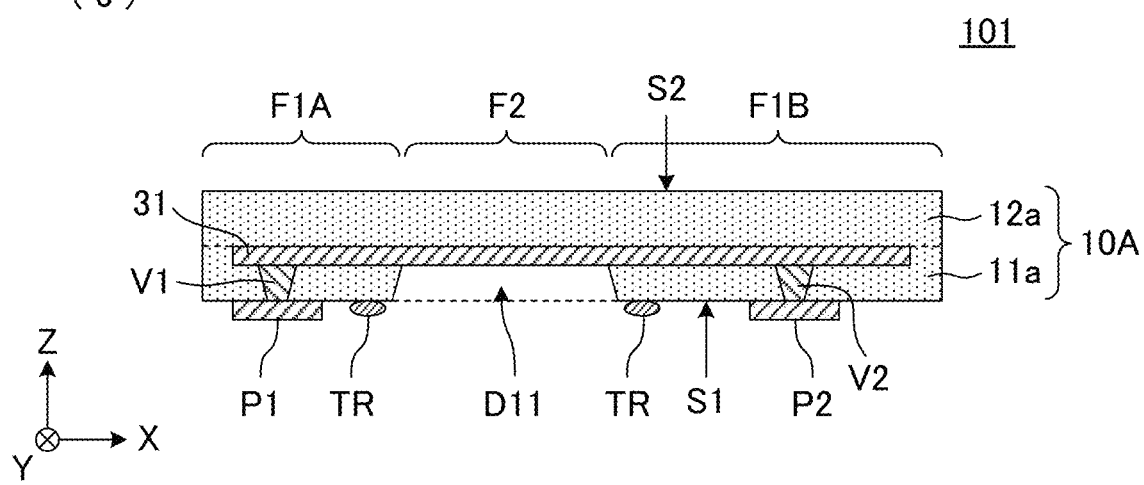

The multilayer resin substrate 101 according to the present preferred embodiment is manufactured by, for example, the following non-limiting manufacturing method. FIG. 3 is a cross-sectional view sequentially showing steps of manufacturing the resin layer 11a before stacking. FIG. 4 is a cross-sectional view sequentially showing steps of manufacturing the multilayer resin substrate 101. It is to be noted that, in FIG. 3 and FIG. 4, for the sake of convenience of explanation, although explanation will be provided in a view with one chip (an individual piece), the actual process of manufacturing the multilayer resin substrate 101 is performed in the state of a collective substrate. The "collective substrate" means a mother substrate that includes a plurality of multilayer resin substrates 101. The same also applies to the view showing the subsequent manufacturing steps.

First, as shown in (1) of FIG. 3, resin layers 11a and 12a (not shown) that are made of a thermoplastic resin are prepared. It is to be noted that the resin layers 11a and 12a are resin sheets made of a liquid crystal polymer (LCP) or a polyether ether ketone (PEEK), for example, as a main component.

Subsequently, electrodes P1 and P2 are formed on a bottom surface (the one surface VS1 of the opening resin layer) of the resin layer 11a. Specifically, metal foil (Cu foil, for example) laminated on the bottom surface of the resin layer 11a is patterned by, for example, photolithography to form the electrodes P1 and P2 on the bottom surface of the resin layer 11a. It is to be noted that, although not shown, a conductor pattern 31 is also formed on the bottom surface (the one surface) of the resin layer 12a.

This step of forming a conductor pattern on only the one surface VS1 of the plurality of resin layers 11a and 12a including the opening resin layer (the resin layer 11a) is an example of a "conductor pattern forming step".

Subsequently, a cutting process is performed from the bottom surface (the one surface VS1 of the opening resin layer) of the resin layer 11a to form the first opening portion AP11. Specifically, a laser beam LR11 is applied from the bottom surface (the one surface VS1) of the resin layer 11a, as shown in (1) of FIG. 3, and thus the first opening portion AP11 as shown in (2) of FIG. 3 is formed. When the first opening portion AP11 is formed by laser irradiation, for example, a scattered piece is easily attached to the one surface VS1 of the opening resin layer. A larger number of scattered pieces are attached to the one surface VS1 closer to the end portion (a laser irradiated position) of the one surface VS1 of the first opening portion AP11 (see the scattered pieces TR in (2) of FIG. 3). In contrast, when the laser irradiation is performed to form the first opening portion AP11, the opposite surface (the top surface of the resin layer 11a) VS2 of the opening resin layer is fixed to a seat (not shown) or the like, so that a scattered piece is not easily attached to the opposite surface VS2. It is to be noted that the scattered piece is a piece in which the resin material of the opening resin layer is evaporated or vaporized during laser irradiation and is attached to the one surface VS1 and may become a piece (a resin material of which the composition has changed, a carbide, or the like, for example) of which the properties have changed by the laser irradiation.

In addition, the first opening portion AP11 may be formed by a cutting process with a drill or a similar tool from the one surface VS1 of the opening resin layer, for example. Further, when the first opening portion AP11 is formed by a cutting process with a drill or a similar tool, a scattered piece (cut waste generated upon the cutting process with a drill) is easily attached to the one surface VS1 of the opening resin layer. A larger number of scattered pieces are attached to the one surface VS1 closer to the end portion of the one surface VS1 of the first opening portion AP11. In addition, the scattered piece may also become a piece of which the properties have changed from the resin material of the resin layer due to heat caused by cutting.

This step of forming the first opening portion AP11 by a cutting process from the one surface VS1 of the opening resin layer after the conductor pattern forming step is an example of a "first opening portion forming step".

In addition, laser beams LR21 and LR22 are applied from the top surface (the opposite surface VS2 of the opening resin layer) of the resin layer 11a to form the second opening portions AP21 and AP22 as shown in (2) of FIG. 3. The second opening portions AP21 and AP22 are holes for the interlayer connection conductors (V1 and V2). The second opening portions AP21 and AP22, in a plan view of the one surface VS1 (when viewed in the Z-axis direction), are formed at positions overlapping with the conductor pattern (the electrodes P1 and P2). Therefore, the conductor pattern is formed on the one surface VS1 (the one surface VS1 of the second opening portions AP21 and AP22 is covered with the conductor pattern) of the second opening portions AP21 and AP22.

This step of forming the second opening portions AP21 and AP22 by laser irradiation from the opposite surface (the top surface of the resin layer 11a) VS2 of the opening resin layer after the conductor pattern forming step is an example of a "second opening portion forming step".

Subsequently, as shown in (3) of FIG. 3, a metal material is filled in the second opening portions AP21 and AP22 to form the interlayer connection conductors V1 and V2. Specifically, conductive paste including metal powder including, for example, Cu and Sn or an alloy including Cu and Sn and a resin material is filled in the second opening portions AP21 and AP22. The conductive paste is solidified by the subsequent heating and pressing and becomes the interlayer connection conductors V1 and V2.

This step of forming interlayer connection conductors V1 and V2 by filling a metal material in the second opening portions AP21 and AP22 after the second opening portion forming step is an example of an "interlayer conductor forming step".

Subsequently, as shown in (4) and (5) in FIG. 4, the plurality of resin layers 11a and 12a are stacked, and heated and pressed (collectively pressed) to form a base material 10A. The plurality of resin layers 11a and 12a are stacked so that the resin layer (the opening resin layer) 11a may be closer to the first main surface than the other resin layer (the resin layer 12a). In addition, the plurality of resin layers 11a and 12a are stacked so that the end portion of the one surface (the bottom surface of the resin layer 11a) VS1 of the first opening portion AP11 may not contact the conductor pattern (the conductor pattern 31 and the electrodes P1 and P2). The base material 10A formed by heating and pressing includes the concave portion D11 defined by the first opening portion AP11 formed in the resin layer 11a, and the resin layer 12a adjacent to the resin layer 11a.

This step of forming a base material 10A by stacking, and heating and pressing the plurality of resin layers 11a and 12a after the first opening portion forming step and the interlayer conductor forming step is an example of a "base material forming step".

According to the manufacturing method described above, in comparison with the multilayer resin substrate of which the end portion of the one surface of the first opening portion AP11 is in contact with the conductor pattern, the multilayer resin substrate 101 in which interlayer peeling at the concave portion D11 is significantly reduced or prevented is able to be easily obtained.

In addition, according to the manufacturing method, the base material 10A is formed by stacking, and heating and pressing (collectively pressing) the plurality of resin layers 11a and 12a that are made of a thermoplastic resin, so that the number of steps of manufacturing the multilayer resin substrate 101 is reduced, and the cost is able to be reduced to a low level. In addition, with such a configuration, a multilayer resin substrate capable of being easier to plastically deform and maintaining (holding) a desired shape is able to be obtained.

Figure 5:
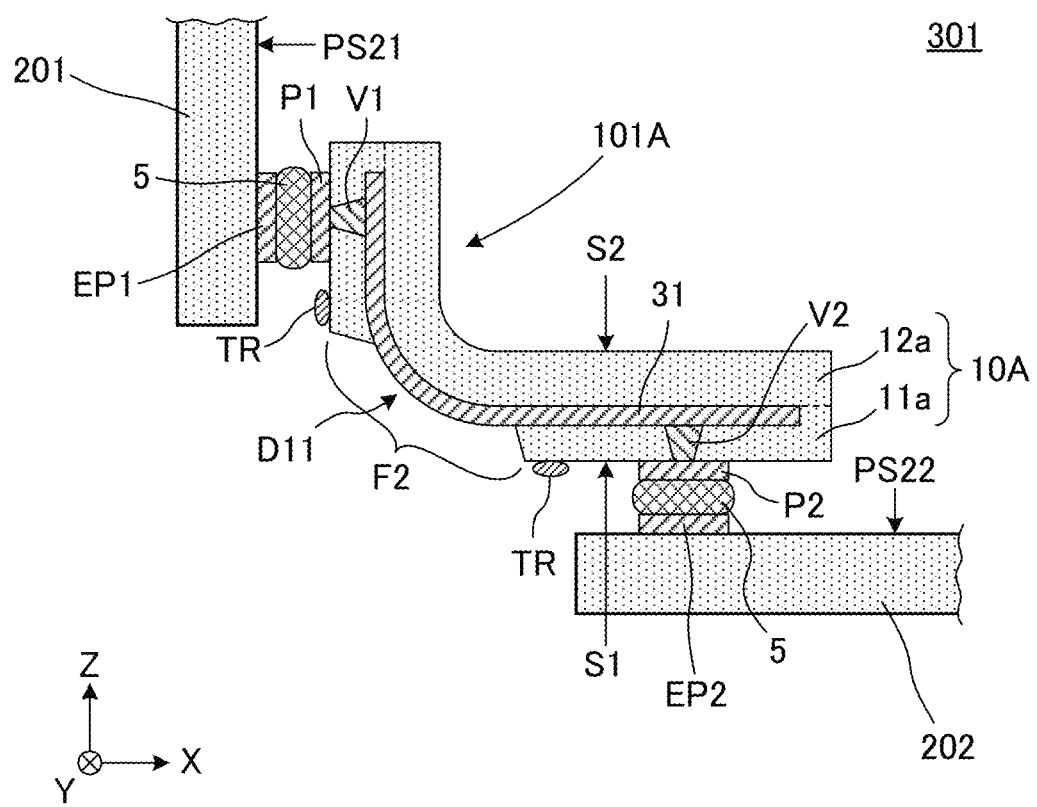
FIG. 5 is a cross-sectional view showing a main portion of an electronic device 301 according to the first preferred embodiment of the present invention.

The multilayer resin substrate according to the present preferred embodiment is used as follows, for example. FIG. 5 is a cross-sectional view showing a main portion of an electronic device 301 according to the first preferred embodiment of the present invention.

The electronic device 301 includes a multilayer resin substrate 101A and circuit substrates 201 and 202. It is to be noted that the electronic device 301 also includes other electronic components, which are not shown in FIG. 5. The multilayer resin substrate 101A is different from the multilayer resin substrate 101 in that a second region F2 is bent (plastically deformed). In other words, the second region F2 includes a bent portion bent in the stacking direction. Other configurations of the multilayer resin substrate 101A are the same or substantially the same as the configurations of the multilayer resin substrate 101.

The bending process on the second region F2 is performed, for example, by bending the base material 10A using a metal mold or the like during heating, and removing the metal mold or the like after the thermoplastic resin of the base material 10A is cooled and solidified. As a result, the multilayer resin substrate 101A of which the bent shape is maintained is obtained.

The circuit substrate 201 includes a first surface PS21, and the circuit substrate 202 includes a second surface PS22. As shown in FIG. 5, the first surface PS21 is a surface parallel or substantially parallel to a YZ plane, and the second surface PS22 is a surface parallel or substantially parallel to an XY plane. An external electrode EP1 is provided on the first surface PS21 of the circuit substrate 201, and an external electrode EP2 is provided on the second surface PS22 of the circuit substrate 202.

The multilayer resin substrate 101A, while the second region F2 is bent, is mounted to the circuit substrates 201 and 202. Specifically, the electrode P1 of the multilayer resin substrate 101A is connected to the external electrode EP1 of the circuit substrate 201 with a conductive bonding material, 5 such as solder, for example. The electrode P2 of the multilayer resin substrate 101A is connected to the external electrode EP2 of the circuit substrate 202 through the conductive bonding material 5.

As with the multilayer resin substrate 101A, in a case in which the second region F2 is bent (deformed), stress is applied to the concave portion D11, and interlayer peeling may occur at the concave portion D11. In contrast, in the multilayer resin substrate according to the present preferred embodiment, the end portion (a portion to which a large number of scattered pieces are attached) of the one surface VS1 of the first opening portion (an opening to define a portion of the concave portion D11) is not in contact with the conductor pattern, so that, even when stress is applied to the concave portion D11, interlayer peeling near the concave portion D11 is significantly reduced or prevented.

Second Preferred Embodiment

In a second preferred embodiment of the present invention, an example in which a plated via and a conductive bonding material are provided for an interlayer connection conductor will be described.

Figure 6A:
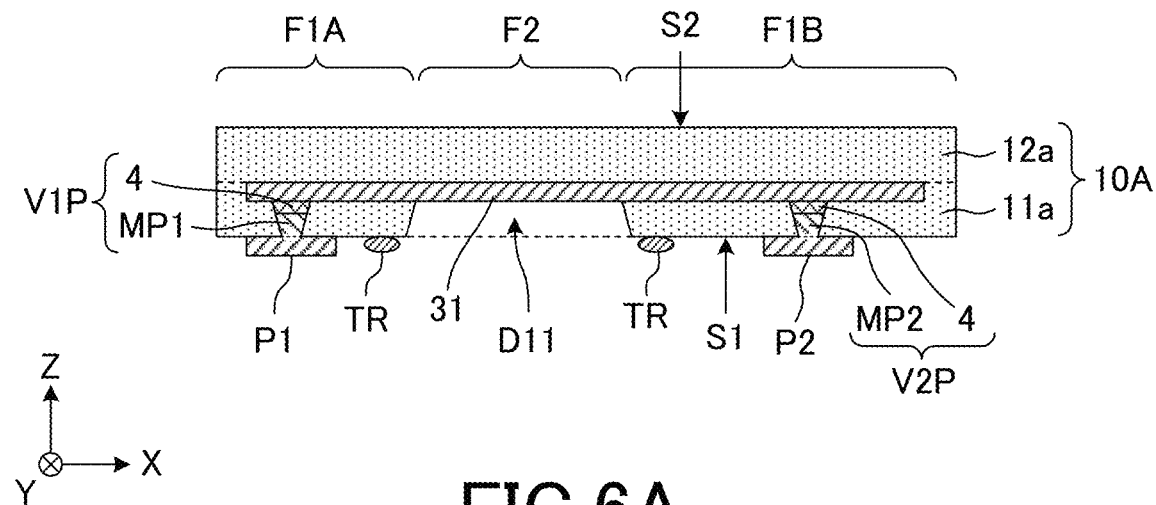
FIG. 6A is a cross-sectional view of a multilayer resin substrate 102 according to a second preferred embodiment of the present invention.
Figure 6B:
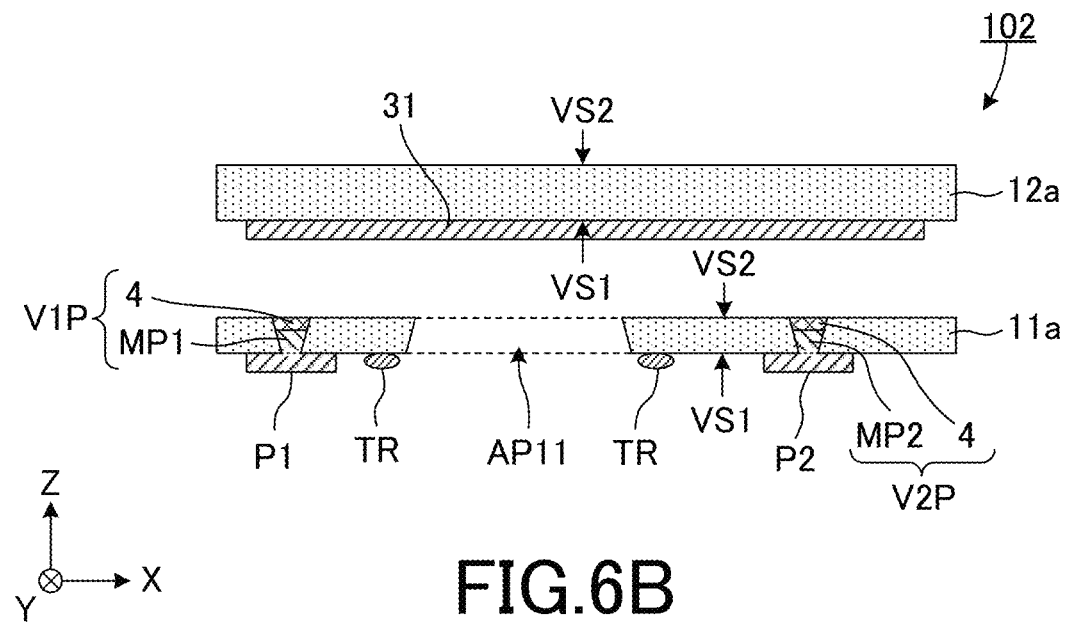
FIG. 6B is an exploded cross-sectional view of the multilayer resin substrate 102.

FIG. 6A is a cross-sectional view of a multilayer resin substrate 102 according to the second preferred embodiment of the present invention, and FIG. 6B is an exploded cross-sectional view of the multilayer resin substrate 102.

The multilayer resin substrate 102 is different from the multilayer resin substrate 101 according to the first preferred embodiment in that interlayer connection conductors V1P and V2P are provided. Other configurations of the multilayer resin substrate 102 are the same or substantially the same as the configurations of the multilayer resin substrate 101.

Hereinafter, the differences from the multilayer resin substrate 101 according to the first preferred embodiment will be described.

The interlayer connection conductor V1P includes a plated via MP1, a conductive bonding material 4, and an alloy layer (not shown). The alloy layer is an intermetallic compound provided between the plated via MP1 and the conductive bonding material 4. As shown in FIG. 6A, the plated via MP1 is connected to another conductor (one end of the conductor pattern 31) through the conductive bonding material 4. The plated via MP1 may be, for example, a plated filled via or a plated through hole, such as Cu, provided by a plating process, in the second opening portion (a through hole) of the resin layer 11a, for example. The conductive bonding material 4 has a low melting point, the conductive bonding material including a metal material such as Cu or Sn and a resin material, for example.

The interlayer connection conductor V2P includes a plated via MP2, a conductive bonding material 4, and an alloy layer (not shown). The alloy layer is an intermetallic compound provided between the plated via MP2 and the conductive bonding material 4. As shown in FIG. 6A, the plated via MP2 is connected to another conductor (the other end of the conductor pattern 31) through the conductive bonding material 4. The plated via MP2 may be a plated filled via or a plated through hole, such as Cu, provided by a plating process, in the second opening portion (a through hole) of the resin layer 11a, for example.

In a case in which the multilayer resin substrate is intended to be used as a high frequency transmission line, although Cu having a small conductor loss is preferably used for a wiring conductor, Cu has a high melting point. Then, although the conductive bonding material of which the melting point is lower than the melting point of Cu is used for an interlayer connection conductor (see the first preferred embodiment), the interlayer connection conductor made only with the conductive bonding material has relatively low conductivity. In contrast, in the present preferred embodiment, the plated vias MP1 and MP2, and the conductive bonding material 4 are used in combination to define the interlayer connection conductors V1P and V2P, so that, in comparison with an interlayer connection conductor made only with a conductive bonding material, a conductor loss is able to be reduced.

In addition, in the present preferred embodiment, the plated vias MP1 and MP2 are plated through holes (or plated filled vias) such as Cu provided by a plating process, and are made of the same material as the material of the conductor pattern (the electrodes P1 and P2). Therefore, the plated via and the conductor pattern are integrated together. Accordingly, an alloy layer (an intermetallic compound) is rarely provided at a portion connecting the plated via and the conductor pattern, so that the mechanical strength of the portion connecting the plated via and the conductor pattern is increased.

Figure 7:
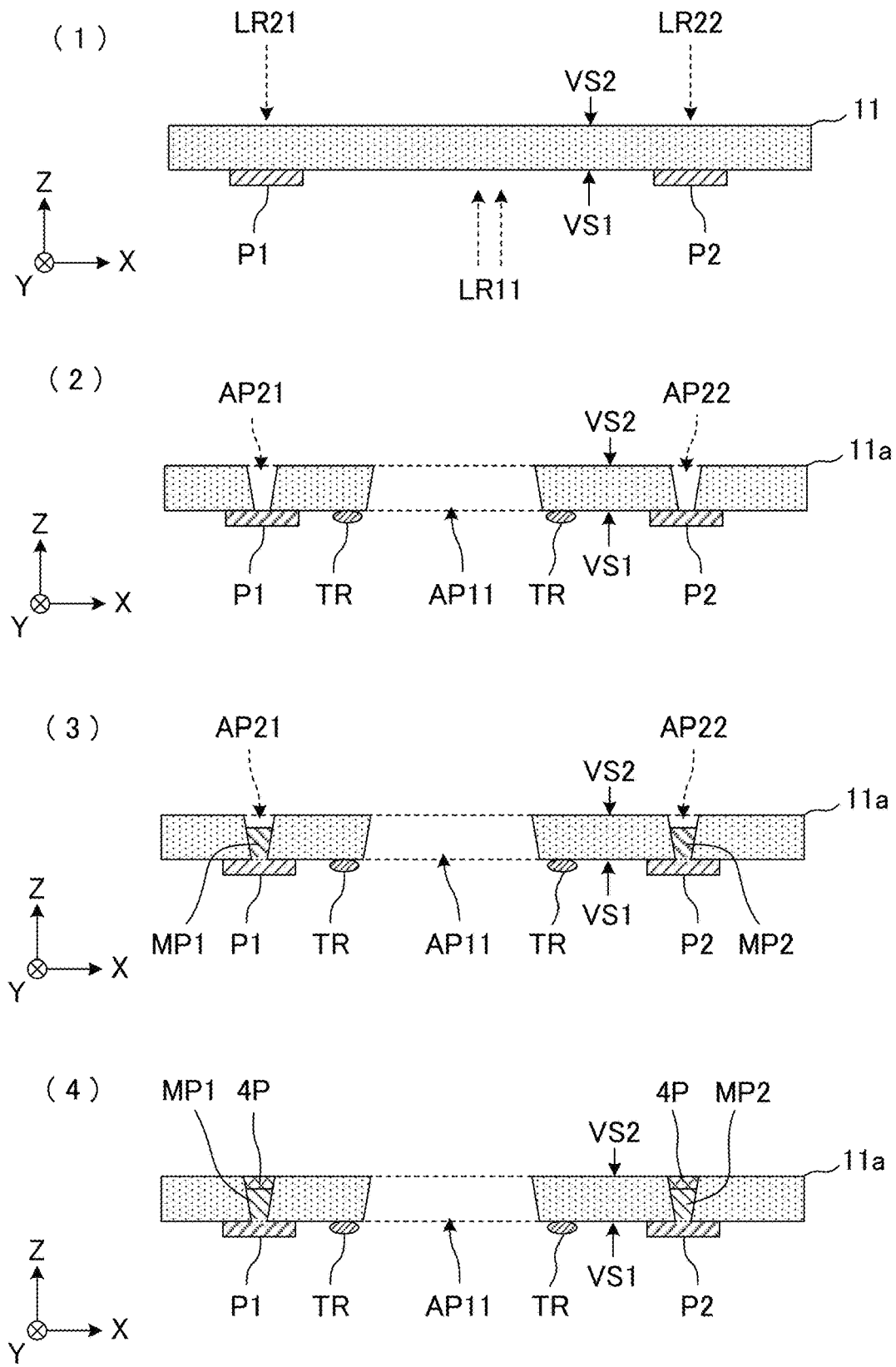
FIG. 7 is a cross-sectional view sequentially showing a method of manufacturing the resin layer 11a before stacking.
Figure 8:
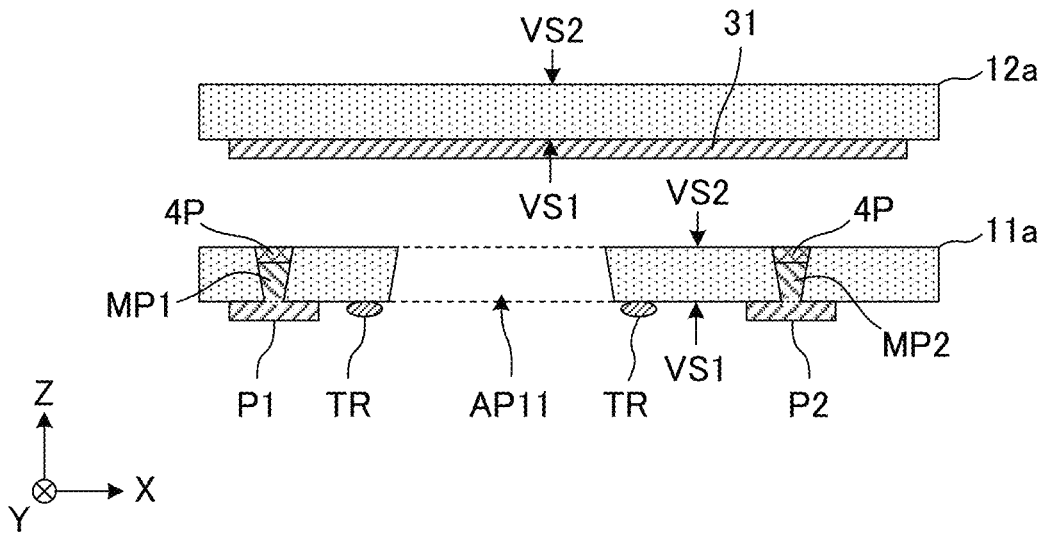
FIG. 8 is a cross-sectional view sequentially showing steps of manufacturing the multilayer resin substrate 102.
Figure 8:
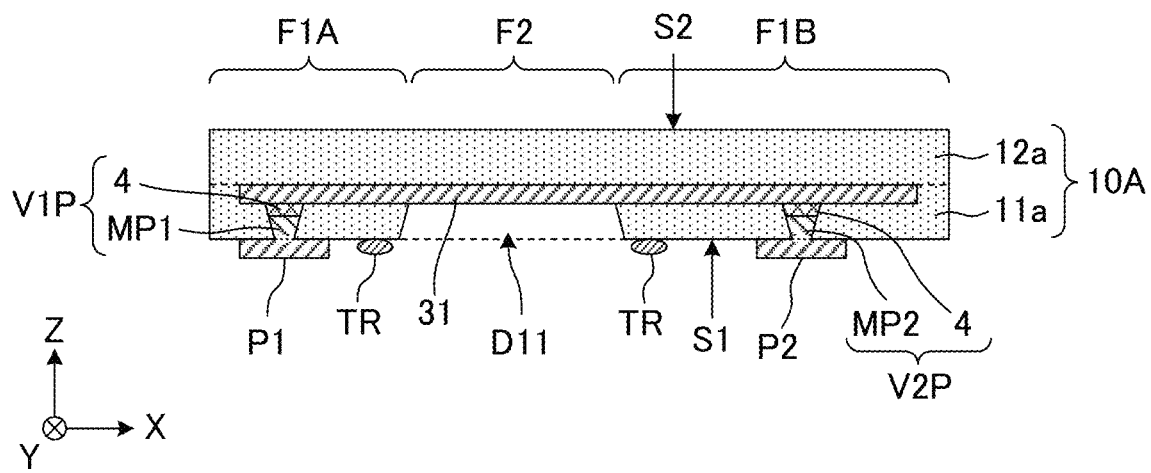

The multilayer resin substrate 102 is manufactured by, for example, the following non-limiting manufacturing method. FIG. 7 is a cross-sectional view sequentially showing a method of manufacturing the resin layer 11a before stacking. FIG. 8 is a cross-sectional view sequentially showing steps of manufacturing the multilayer resin substrate 102.

First, as shown in (1) of FIG. 7, the resin layers 11a and 12a (not shown) that are made of a thermoplastic resin are prepared, and electrodes P1 and P2 are formed on the bottom surface of the resin layer 11a. It is to be noted that, although not shown, a conductor pattern 31 is also formed on the bottom surface of the resin layer 12a.

This step of forming a conductor pattern on only the one surface VS1 of the plurality of resin layers 11a and 12a including the opening resin layer (the resin layer 11a) is an example of a "conductor pattern forming step".

Subsequently, a cutting process is performed (for example, a laser beam LR11 is applied) from the bottom surface (the one surface VS1 of the opening resin layer) of the resin layer 11a to form the first opening portion AP11 as shown in (2) of FIG. 7.

This step of forming the first opening portion AP11 by a cutting process from the one surface (the bottom surface of the resin layer 11a) VS1 of the opening resin layer after the conductor pattern forming step is an example of a "first opening portion forming step".

In addition, a cutting process is performed (for example, laser beams LR21 and LR22 are applied) from the top surface (the opposite surface VS2 of the opening resin layer) of the resin layer 11a to form the second opening portions AP21 and AP22 as shown in (2) of FIG. 7.

This step of forming the second opening portions AP21 and AP22 by a cutting process from the opposite surface (the top surface of the resin layer 11a) VS2 of the opening resin layer after the conductor pattern forming step is an example of a "second opening portion forming step".

Subsequently, as shown in (3) and (4) in FIG. 7, a plated via MP1 is formed by filling a metal material (such as Cu, for example) in the second opening portion AP21, and then a conductive bonding material 4P is disposed on the surface (the top surface) of the plated via MP1. In addition, a plated via MP2 is formed by filling a metal material (such as Cu, for example) in the second opening portion AP22, and then a conductive bonding material 4P is disposed on the surface (the top surface) of the plated via MP2. The conductive bonding material 4P is conductive paste including a metal such as Cu or Sn and a resin material, for example.

This step of forming plated vias MP1 and MP2 in the second opening portions AP21 and AP22 and disposing a conductive bonding material 4P on the surface of the plated vias MP1 and MP2 is an example of an "interlayer conductor forming step".

Subsequently, as shown in (5) of FIG. 8, the plurality of resin layers 11a and 12a are stacked on each other. At such a time, the conductive bonding material 4P disposed on the surface of the plated via MP1 contacts one end of the conductor pattern 31. In addition, the conductive bonding material 4P disposed on the surface of the plated via MP2 contacts the other end of the conductor pattern 31. Subsequently, the base material 10A is formed by heating and pressing of the stacked resin layers 11a and 12a. The conductive bonding material (the conductive paste) 4P is solidified by heat during heating and pressing (to become a conductive bonding material 4 shown in (6) of FIG. 8). As a result, an alloy layer (not shown) is formed between each of the plated vias MP1 and MP2, and the conductive bonding material 4.

This step of forming a base material 10A by heating and pressing, solidifying a conductive bonding material 4P by heating and pressing, and forming an alloy layer between the plated vias MP1 and MP2 and the conductive bonding material 4 is an example of a "base material forming step".

According to the manufacturing method described above, the plated vias MP1 and MP2 and the conductive bonding material 4 are used in combination to form interlayer connection conductors V1P and V2P, so that, in comparison with a case in which an interlayer connection conductor is formed only with a conductive bonding material, a multilayer resin substrate having a reduced conductor loss is able to be obtained.

It is to be noted that, while the present preferred embodiment is an example of the interlayer connection conductor including a plated through hole (or a plated filled via) such as Cu, for example, provided by a plating process, the present invention is not limited to such a configuration. The interlayer connection conductor may be formed by using, for example, a Cu pin having a small diameter or a Cu wire cut in a predetermined length unit, and a conductive bonding material.

Third Preferred Embodiment

In a third preferred embodiment of the present invention, an example of a multilayer resin substrate in which an end portion of one surface of a first opening portion is bonded to a surface of a resin layer will be described.

Figure 9A:
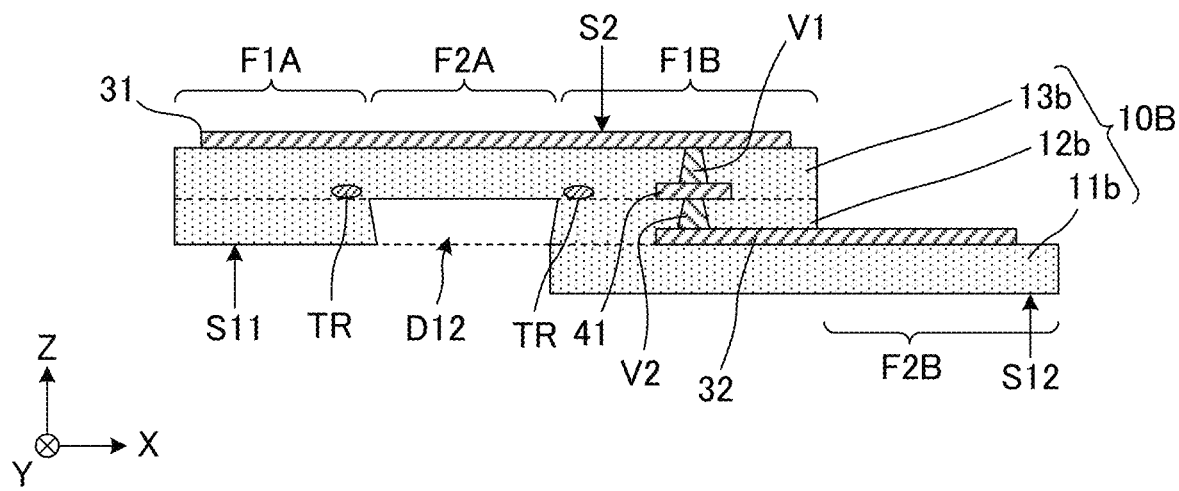
FIG. 9A is a cross-sectional view of a multilayer resin substrate 103 according to a third preferred embodiment of the present invention.
Figure 9B:
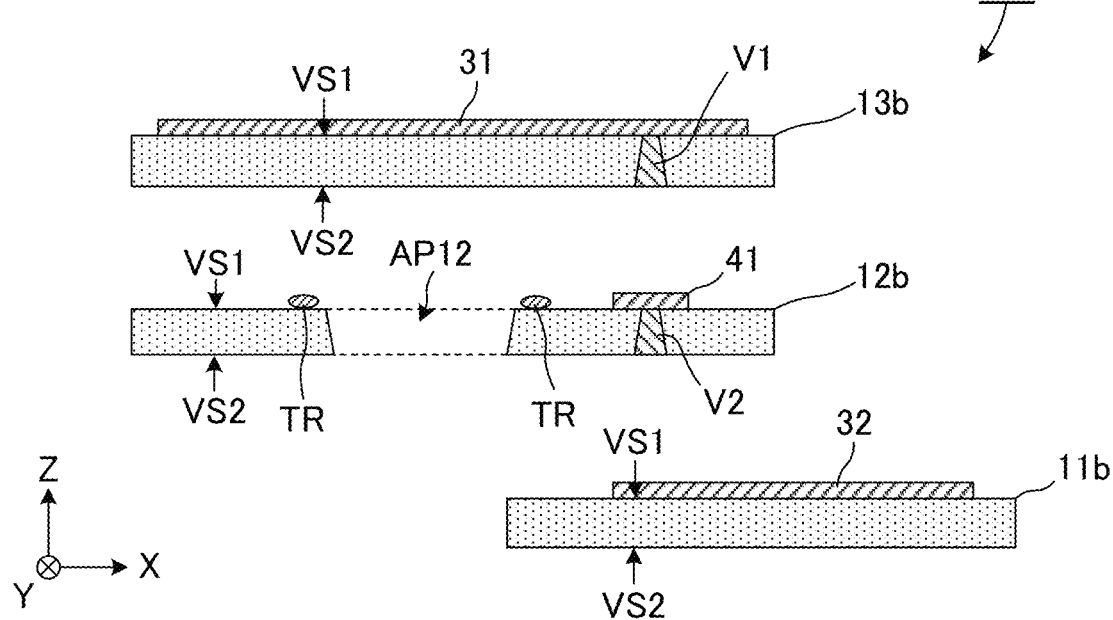
FIG. 9B is an exploded cross-sectional view of the multilayer resin substrate 103.

FIG. 9A is a cross-sectional view of a multilayer resin substrate 103 according to the third preferred embodiment of the present invention, and FIG. 9B is an exploded cross-sectional view of the multilayer resin substrate 103.

The multilayer resin substrates 103 is different from the multilayer resin substrate 101 according to the first preferred embodiment in that a base material 10B including a concave portion D12 is provided, and conductor patterns 32 and 41 are provided. In addition, the multilayer resin substrate 103 is different from the multilayer resin substrate 101 in that the conductor pattern 31 is provided on the second main surface S2 of the base material 10B. Other configurations of the multilayer resin substrate 103 are the same or substantially the same as the configurations of the multilayer resin substrate 101.

Hereinafter, the differences from the multilayer resin substrate 101 according to the first preferred embodiment will be described.

The base material 10B is a rectangular or substantially rectangular flat plate of which the longitudinal direction coincides with the X-axis direction. The base material 10B includes first main surfaces S11 and S12, and a second main surface S2 being an opposite surface of the first main surfaces S11 and S12. A concave portion D12 that is thinner in the Z-axis direction than other portions is provided in the first main surface S11 of the base material 10B.

The base material 10B includes first regions F1A and F1B, and second regions F2A and F2B. The first region F1A, the second region F2A, the first region F1B, and the second region F2B are disposed in this order in the X-axis direction. The second region F2A is a portion in which a concave portion D12 is provided in the base materials 10B. Since the thickness of the second regions F2A and F2B is smaller than the thickness of the first regions F1A and F1B, the second regions F2A and F2B are easier to deform than the first regions F1A and F1B.

The base material 10B is a stacked body obtained by stacking a plurality of resin layers 11b, 12b, and 13b that are made of a thermoplastic resin, for example. The configuration of the resin layers 11b, 12b, and 13b is the same or substantially the same as the configuration of the resin layers 11a and 12a described in the first preferred embodiment. In the present preferred embodiment, the resin layer 12b corresponds to an "opening resin layer".

A conductor pattern 32 is provided on the top surface (the one surface VS1) of the resin layer 11b. The conductor pattern 32 is a linear conductor pattern extending in the X-axis direction (the transmission direction). The conductor pattern 32 is a conductor pattern such as Cu foil, for example.

A conductor pattern 41 is provided on the top surface (the one surface VS1 of the opening resin layer) of the resin layer 12b. The conductor pattern 41 is a rectangular or substantially rectangular conductor pattern disposed near the end (a right end of the resin layer 12b in FIG. 9B) of the resin layer 12b. The conductor pattern 41 is Cu foil, for example.

In addition, an interlayer connection conductor V2 is provided on the resin layer 12b. The interlayer connection conductor V2 is a conductor provided by filling a metal material in a second opening portion (not shown) formed by a cutting process from the bottom surface (the opposite surface VS2 of the opening resin layer) of the resin layer 12b. The second opening portion is a circular or substantially circular through hole formed by laser irradiation from the opposite surface VS2 of the opening resin layer, for example. The interlayer connection conductor V2 is provided in the second opening portion by providing conductive paste preferably including one or more of Cu, Sn, and the like or an alloy preferably including one or more of Cu, Sn, and the like, for example, and solidifying the conductive paste through the subsequent heating and pressing. The interlayer connection conductor (the second opening portion) V2 has a truncated conical shape in which an area of the one surface (the top surface of the resin layer 12b) VS1 of the opening resin layer is small, and an area of the opposite surface (the bottom surface of the resin layer 12b) VS2 of the opening resin layer is large. The second opening portion, when viewed in the Z-axis direction, is provided at a position overlapping with the conductor pattern 41.

Further, a first opening portion AP12 is provided in the resin layer 12b. The first opening portion AP12 is a rectangular or substantially rectangular through hole provided by a cutting process from the top surface (the one surface VS1 of the opening resin layer) of the resin layer 11b. The first opening portion AP12 is formed by laser irradiation from the one surface VS1 of the opening resin layer, for example. The first opening portion AP12, when viewed in the Z-axis direction, is provided at a position at which the conductor pattern 41 is not provided.

A conductor pattern 31 is provided on the top surface (the one surface VS1) of the resin layer 13b. The conductor pattern 31 is a linear conductor pattern extending in the X-axis direction (the transmission direction). In addition, an interlayer connection conductor V1 is provided on the resin layer 13b. The interlayer connection conductor V1 is provided by filling a metal material in a second opening portion (not shown) formed by a cutting process from the bottom surface (the opposite surface VS2) of the resin layer 12b. The interlayer connection conductor V1 has a truncated conical shape in which an area of the opposite surface VS2 of the resin layer 13b is large, and an area of the one surface VS1 is small.

In the present preferred embodiment, the one surface VS1 of the opening resin layer (the resin layer 12b) is not in contact with the one surface VS1 of the other resin layers 11b and 13b. Specifically, as shown in FIG. 9A, the one surface VS1 of the resin layer 11b is bonded to the opposite surface VS2 of the resin layer (the opening resin layer) 12b, and the one surface VS1 of the resin layer 12b is bonded to the opposite surface VS2 of the resin layer 13b. In addition, the conductor pattern 31 is connected to the conductor pattern 32 through the interlayer connection conductors V1 and V2 and the conductor pattern 41. The concave portion D12 is defined by the first opening portion AP12 provided in the resin layer 12b, and the resin layer 13b adjacent to the resin layer 12b.

In the multilayer resin substrate 103 according to the present preferred embodiment, the end portion (a portion to which a large number of scattered pieces are attached) of the one surface VS1 of the first opening portion AP12 is also not in contact with the conductor pattern (the conductor pattern 31 and the electrodes P1 and P2). With such a configuration, as with the multilayer resin substrate 101 according to the first preferred embodiment, in comparison with a case in which the end portion of the one surface VS1 of the first opening portion AP12 is in contact with a conductor pattern, the interlayer peeling at the concave portion D12 is significantly reduced or prevented.

In addition, in the multilayer resin substrate 103 according to the present preferred embodiment, the one surface VS1 of the opening resin layer (the resin layer 12b) is bonded to the opposite surface VS2 of the other resin layer 13b on which the conductor pattern 31 is provided. According to this configuration, the one surface VS1 of the opening resin layer is not bonded to the one surface VS1 of the other resin layer 13b, so that a change in the electrical characteristics due to a scattered piece (particularly, a scattered piece TR attached to the end portion of the one surface VS1 of the first opening portion AP12) being attached when the first opening portion AP12 is directly in contact with the conductor pattern 31 of the other resin layer 13b is significantly reduced or prevented.

Further, in the multilayer resin substrate 103 according to the present preferred embodiment, the opposite surface VS2 of the opening resin layer (the resin layer 12b) is bonded to the one surface VS1 of the other resin layer 11b on which the conductor pattern 32 is provided. For example, in a case in which the one surface VS1 of the opening resin layer is bonded to the one surface VS1 of the other resin layer 11b, the scattered piece (particularly, the scattered piece TR) and the conductor pattern 32 provided on the one surface VS1 of the resin layer 11b contact each other due to a positional shift during stacking, so that a change in the electrical characteristics of the multilayer resin substrate may occur. In contrast, according to the above configuration, the one surface VS1 of the opening resin layer is not bonded to the one surface VS1 of the other resin layer 11b, so that a change in the electrical characteristics due to the scattered piece contacting the conductor pattern 32 of the different resin layer 11b by a positional shift or the like during stacking is significantly reduced or prevented.

Fourth Preferred Embodiment

In a fourth preferred embodiment of the present invention, an example of a multilayer resin substrate including a plurality of opening resin layers will be described.

Figure 10A:
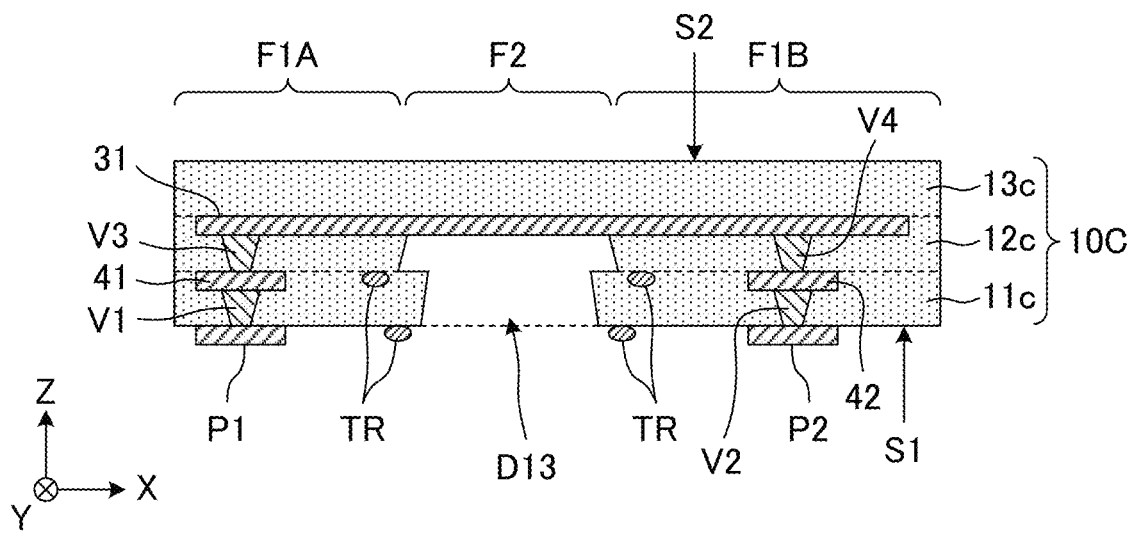
FIG. 10A is a cross-sectional view of a multilayer resin substrate 104A according to a fourth preferred embodiment of the present invention.
Figure 10B:
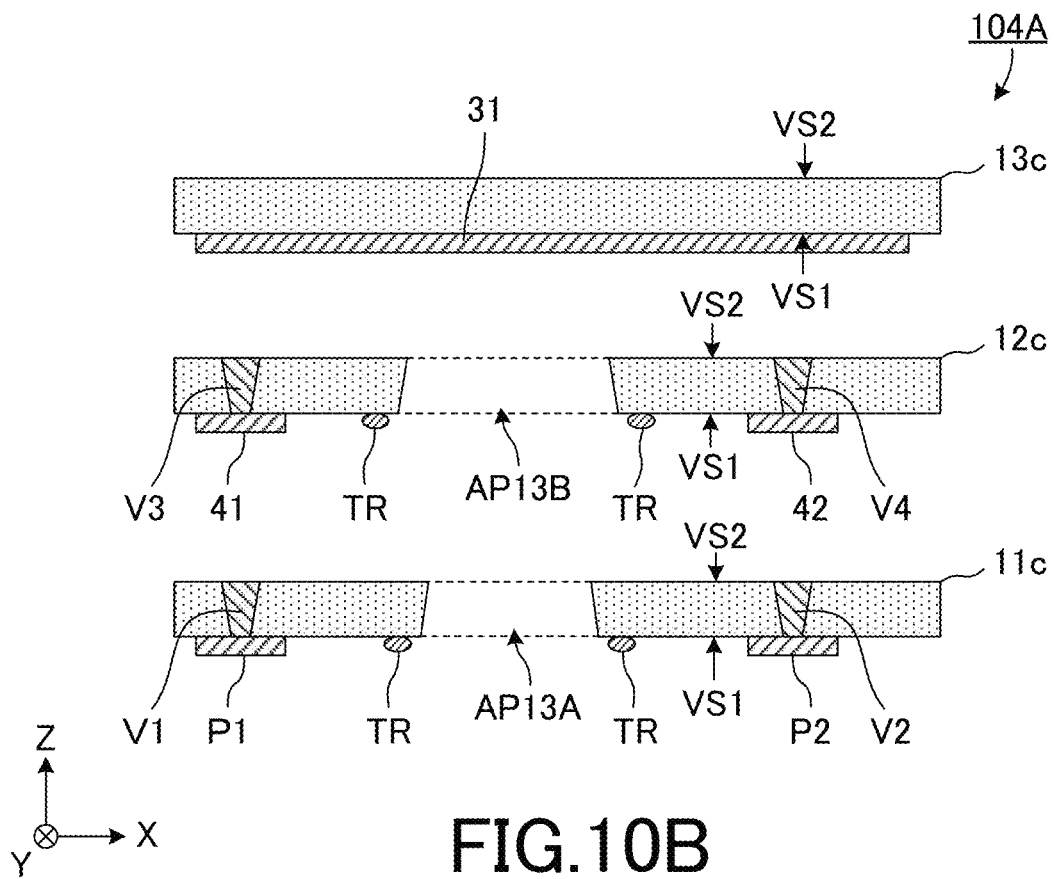
FIG. 10B is an exploded cross-sectional view of the multilayer resin substrate 104A.

FIG. 10A is a cross-sectional view of a multilayer resin substrate 104A according to the fourth preferred embodiment of the present invention, and FIG. 10B is an exploded cross-sectional view of the multilayer resin substrate 104A.

The multilayer resin substrate 104A is different from the multilayer resin substrate 101 according to the first preferred embodiment in that a base material 10C, conductor patterns 41 and 42, interlayer connection conductors V3 and V4, and the like are provided. Other configurations of the multilayer resin substrate 104A are the same or substantially the same as the configurations of the multilayer resin substrate 101. Hereinafter, the differences from the multilayer resin substrate 101 will be described.

The base material 10C is a stacked body obtained by stacking a plurality of resin layers 11c, 12c, and 13c that are made of a thermoplastic resin, for example. A concave portion D13 is provided in a first main surface S1 of the base material 10C. The configuration of the resin layers 11c, 12c, and 13c is the same or substantially the same as the configuration of the resin layers 11a and 12a described in the first preferred embodiment.

In the present preferred embodiment, the resin layers 11c and 12c each correspond to an "opening resin layer". The opening resin layer (the resin layers 11c and 12c) is disposed closer to the first main surface S1 than other resin layer (the resin layer 13c). Specifically, a plurality of opening resin layers (the resin layers 11c and 12c) are continuously stacked in the Z-axis direction. It is to be noted that the resin layer 11c is disposed closest to the first main surface S1 among the plurality of opening resin layers.

Electrodes P1 and P2 are provided on a bottom surface (the one surface VS1 of the opening resin layer) of the resin layer 11c. The configuration of the electrodes P1 and P2 is the same or substantially the same as the configuration of the electrodes P1 and P2 described in the first preferred embodiment. In addition, a first opening portion AP13A is provided in the resin layer 11c. The first opening portion AP13A is a rectangular or substantially rectangular through hole formed by a cutting process (laser irradiation, for example) from the bottom surface (the one surface VS1 of the opening resin layer) of the resin layer 11c. The first opening portion AP13A has a truncated conical shape in which an area of the one surface (the bottom surface of the resin layer 11c) VS1 of the opening resin layer is large and an area of the opposite surface (the top surface of the resin layer 11c) VS2 of the opening resin layer is small. The first opening portion AP13A, when viewed in the Z-axis direction, is provided at a position not overlapping with the conductor pattern (the electrodes P1 and P2). As shown in FIG. 10B, a large number of scattered pieces TR are attached to the end portion of the one surface of the first opening portion AP13A.

In addition, interlayer connection conductors V1 and V2 and a second opening portion (not shown) are provided in the resin layer 11c. The configuration of the interlayer connection conductors V1 and V2 and the second opening portion is the same or substantially the same as the configuration of the interlayer connection conductor and the second opening portion described in the first preferred embodiment.

Conductor patterns 41 and 42 are provided on the bottom surface (the one surface VS1 of the opening resin layer) of the resin layer 12c. The conductor pattern 41 is a rectangular or substantially rectangular conductor pattern disposed near one end (a left end of the resin layer 12c in FIG. 10B) of the resin layer 12c. The conductor pattern 42 is a rectangular or substantially rectangular conductor pattern disposed near the other end (a right end of the resin layer 12c in FIG. 10B) of the resin layer 12c. The conductor patterns 41 and 42 are Cu foil, for example.

In addition, a first opening portion AP13B is provided in the resin layer 12c. The first opening portion AP13B is a rectangular or substantially rectangular through hole formed by a cutting process (laser irradiation, for example) from the bottom surface (the one surface VS1 of the opening resin layer) of the resin layer 12c. The first opening portion AP13B has a truncated conical shape in which an area of the one surface (the bottom surface of the resin layer 12c) VS1 of the opening resin layer is large and an area of the opposite surface (the top surface of the resin layer 12c) VS2 of the opening resin layer is small. The first opening portion AP13B, when viewed in the Z-axis direction, is provided at a position not overlapping with the conductor patterns 41 and 42. As shown in FIG. 10B, a large number of scattered pieces TR are attached to the end portion of the one surface of the first opening portion AP13B.

Further, interlayer connection conductors V3 and V4 are provided on the resin layer 12c. The interlayer connection conductors V3 and V4 are provided by filling a metal material in a second opening portion (not shown) formed by a cutting process (laser irradiation, for example) from the top surface (the opposite surface VS2 of the opening resin layer) of the resin layer 12c. The interlayer connection conductors (the second opening portions) V3 and V4 have a truncated conical shape in which an area of the one surface (the bottom surface of the resin layer 12c) VS1 of the opening resin layer is small, and an area of the opposite surface (the top surface of the resin layer 12c) VS2 of the opening resin layer is large. The second opening portions, when viewed in the Z-axis direction, are provided at positions each overlapping with the conductor patterns 41 and 42.

A conductor pattern 31 is provided on the bottom surface (the one surface VS1) of the resin layer 13c. The configuration of the conductor pattern 31 is the same or substantially the same as the conductor pattern 31 described in the first preferred embodiment.

In the multilayer resin substrate 104A, as shown in FIG. 10A, the opposite surface VS2 of the resin layer (the opening resin layer) 11c is bonded to the one surface VS1 of the resin layer (the opening resin layer) 12c, and the opposite surface VS2 of the resin layer 12c is bonded to the one surface VS1 of the resin layer 13c. In addition, the electrode P1 is connected to one end of the conductor pattern 31 through the conductor pattern 41 and the interlayer connection conductors V1 and V3. The other end of the conductor pattern 31 is connected to the electrode P2 through the conductor pattern 42 and the interlayer connection conductors V2 and V4. As shown in FIG. 10A and FIG. 10B, the concave portion D13 is defined by the first opening portions AP13A and AP13B, and the resin layer 13c adjacent to the resin layer 12c.

As described above, the bonding strength of the bonded surface between the resin layers to which the scattered piece is attached is lower than the bonding strength of the bonded surface between the resin layers to which the scattered piece is not attached. In contrast, in the multilayer resin substrate 104A, the end portion (a portion to which a large number of scattered pieces are attached) of the one surface VS1 of the first opening portions AP13A and AP13B is not in contact with the conductor pattern. With such a configuration, even when the first opening portions AP13A and AP13B are configured to be continuously disposed in the Z-axis direction, interlayer peeling at the concave portion is significantly reduced or prevented.

It is to be noted that the configuration shown in FIG. 10A shows a wall of the concave portion that includes a corner portion in an intermediate position in a depth direction. However, a surface of the wall of the concave portion may be processed into a smooth surface such as a flat shape or a curved shape, for example, by performing a process such as cutting, grinding, or heating, on the corner portion.

Figure 11A:
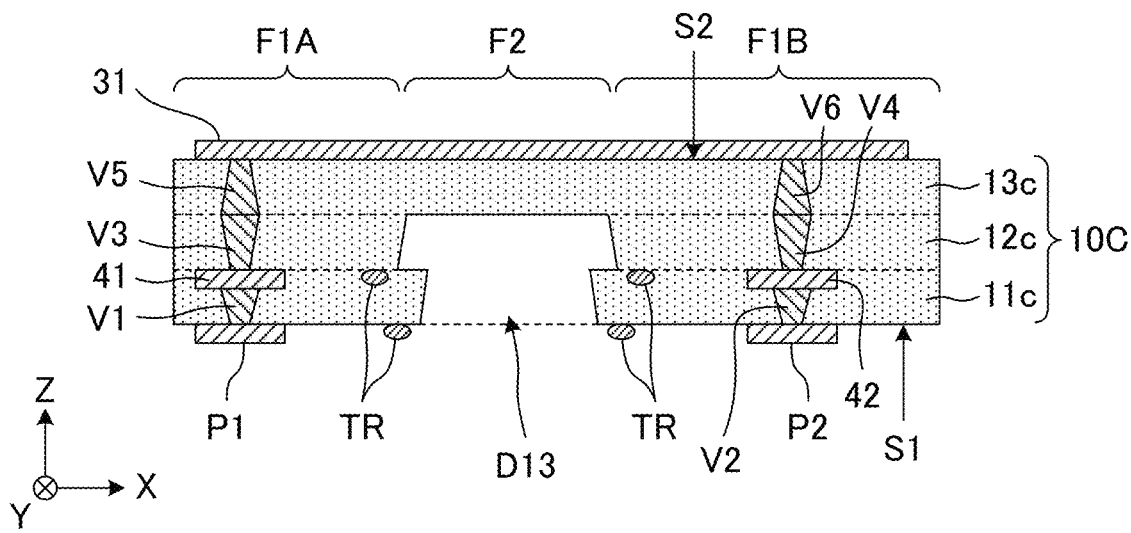
FIG. 11A is a cross-sectional view of another multilayer resin substrate 104B according to the fourth preferred embodiment of the present invention.
Figure 11B:
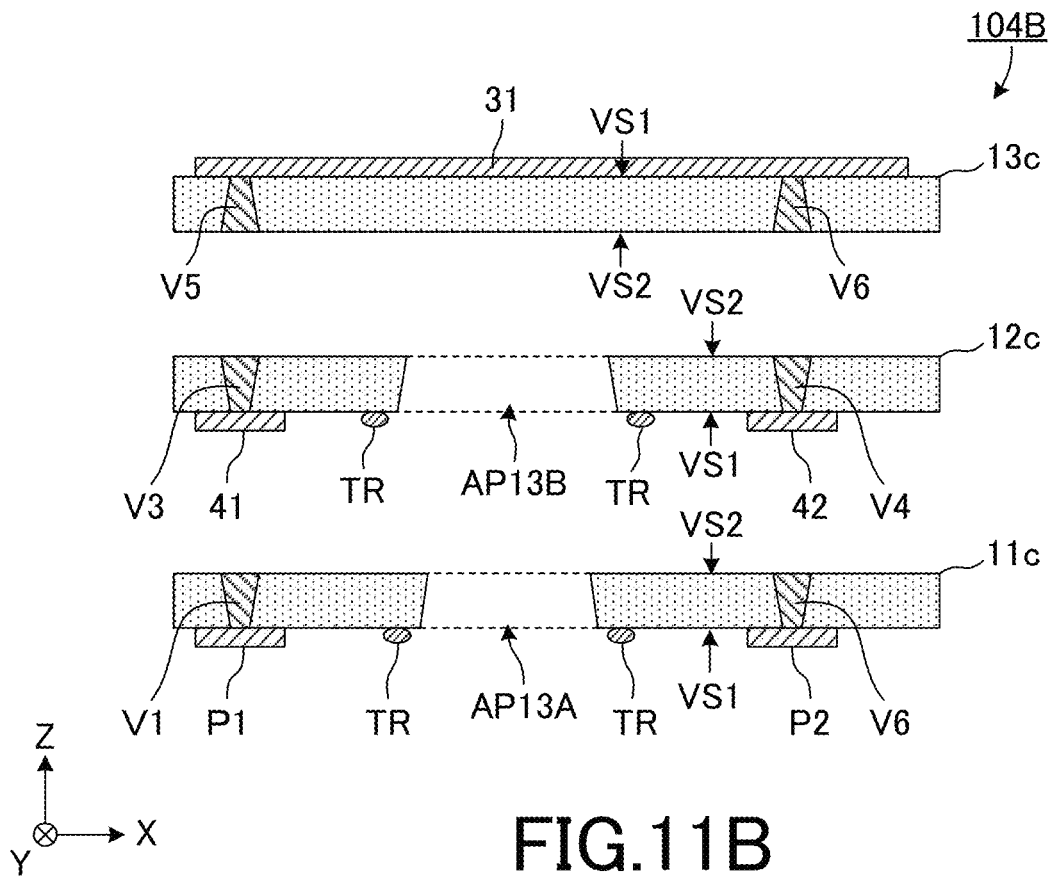
FIG. 11B is an exploded cross-sectional view of the multilayer resin substrate 104B.

Subsequently, a modification of the multilayer resin substrate 104A according to the fourth preferred embodiment will be described. FIG. 11A is a cross-sectional view of another multilayer resin substrate 104B according to the fourth preferred embodiment of the present invention, and FIG. 11B is an exploded cross-sectional view of the multilayer resin substrate 104B.

The multilayer resin substrate 104B is different from the multilayer resin substrate 104 in that a conductor pattern 31 is provided on a surface (a second main surface S2) of the base material 10C. In addition, the multilayer resin substrate 104B is different from the multilayer resin substrate 104A in that interlayer connection conductors V5 and V6 are further provided. Other configurations of the multilayer resin substrate 104B are the same or substantially the same as the configurations of the multilayer resin substrate 104A. Hereinafter, the differences from the multilayer resin substrate 104A will be described.

In the multilayer resin substrate 104B, a conductor pattern 31 is provided on the top surface (the one surface VS1) of the resin layer 13c. The configuration of the conductor pattern 31 is the same or substantially the same as the conductor pattern described in the first preferred embodiment. In addition, interlayer connection conductors V5 and V6 are provided on the resin layer 13c. The interlayer connection conductors V5 and V6 are conductors provided by filling a metal material in a second opening portion (not shown) formed by a cutting process (laser irradiation, for example) from the bottom surface (the opposite surface VS2) of the resin layer 13c.

In the multilayer resin substrate 104B, as shown in FIG. 11A, the opposite surface VS2 of the resin layer (the opening resin layer) 11c is bonded to the one surface VS1 of the resin layer (the opening resin layer) 12c, and the opposite surface VS2 of the resin layer 12c is bonded to the opposite surface VS2 of the resin layer 13c. In addition, the electrode P1 is connected to one end of the conductor pattern 31 through the conductor pattern 41 and the interlayer connection conductors V1, V3, and V5. The other end of the conductor pattern 31 is connected to the electrode P2 through the conductor pattern 42 and the interlayer connection conductors V2, V4, and V6.

Figure 12A:
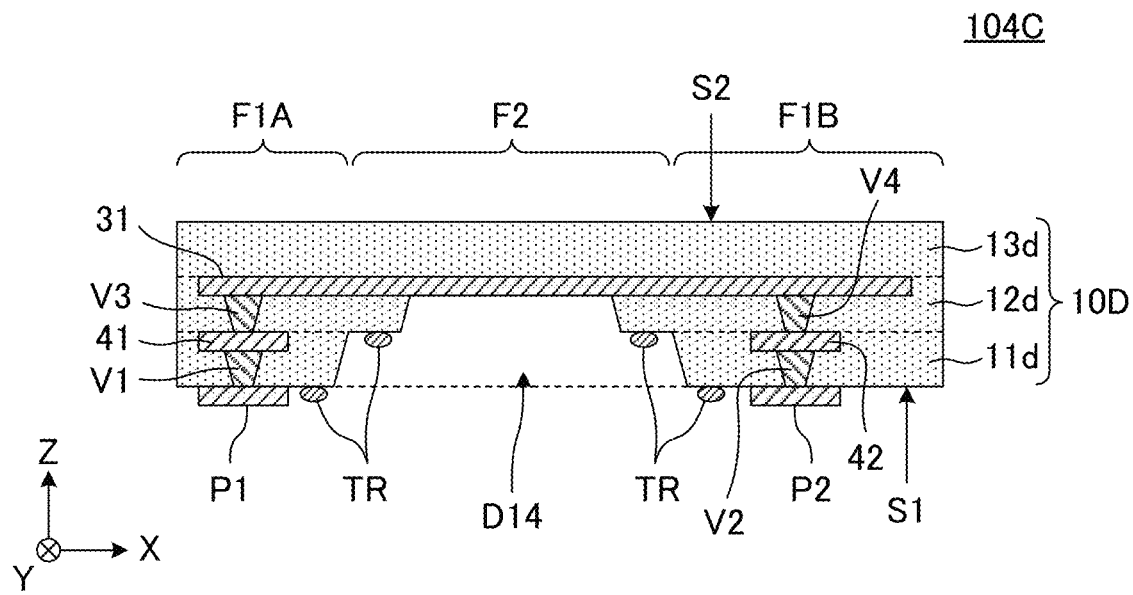
FIG. 12A is a cross-sectional view of another multilayer resin substrate 104C according to the fourth preferred embodiment of the present invention.
Figure 12B:
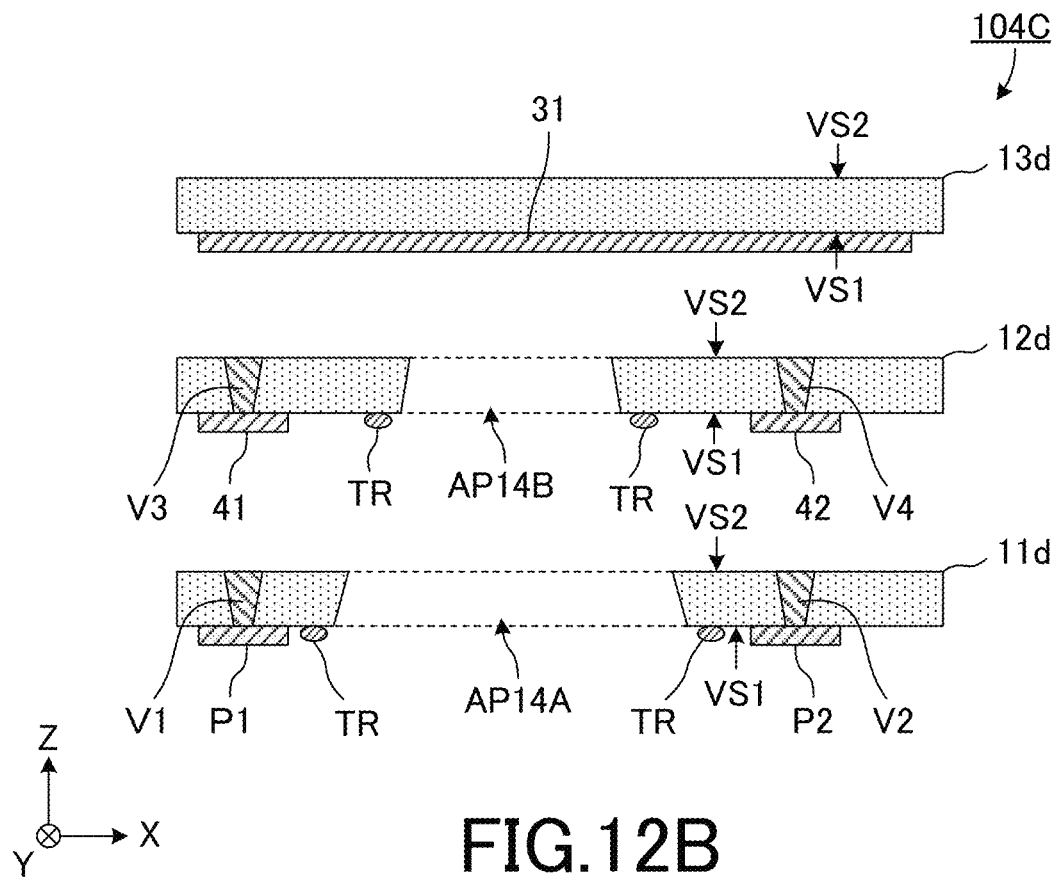
FIG. 12B is an exploded cross-sectional view of the multilayer resin substrate 104C.

Further, a modification of the multilayer resin substrate 104A according to the fourth preferred embodiment will be described. FIG. 12A is a cross-sectional view of another multilayer resin substrate 104C according to the fourth preferred embodiment of the present invention, and FIG. 12B is an exploded cross-sectional view of the multilayer resin substrate 104C.

The multilayer resin substrate 104C is different from the multilayer resin substrate 104A in that a base material 10D is provided. Other configurations of the multilayer resin substrate 104C are the same or substantially the same as the configurations of the multilayer resin substrate 104A. Hereinafter, the differences from the multilayer resin substrate 104A will be described.

The base material 10D is a stacked body obtained by stacking a plurality of resin layers 11d, 12d, and 13d that are made of a thermoplastic resin, for example. A concave portion D14 is provided in a first main surface S1 of the base material 10D. The configuration of the resin layers 11d, 12d, and 13d is the same or substantially the same as the configuration of the resin layers 11c, 12c, and 13c of the multilayer resin substrate 104A.

A first opening portion AP14A is provided in the resin layer 11d. The first opening portion AP14A is a rectangular or substantially rectangular through hole formed by a cutting process (laser irradiation, for example) from the bottom surface (the one surface VS1 of the opening resin layer) of the resin layer 11d.

A first opening portion AP14B is provided in the resin layer 12d. The first opening portion AP14B is a rectangular or substantially rectangular through hole formed by a cutting process (laser irradiation, for example) from the bottom surface (the one surface VS1 of the opening resin layer) of the resin layer 12d. As shown in FIG. 12B, the first opening portions AP14A and AP14B are adjacent to each other in the Z-axis direction. In addition, an area of the one surface (the bottom surface of the resin layer 12d) VS1 of the first opening portion AP14B is larger than an area of the opposite surface (the top surface of the resin layer 11d) VS2 of the first opening portion AP14A.

In the multilayer resin substrate 104C, an end portion of the opposite surface (the top surface of the resin layer 11d) VS2 of the first opening portion AP14A positioned closer to the first main surface S1, when viewed in the Z-axis direction, is positioned farther outside than an end portion of the one surface (the bottom surface of the resin layer 12d) VS1 of the first opening portion AP14B positioned closer to the second main surface S2. In a case in which the end portion of the opposite surface VS2 of the first opening portion AP14A is not bonded to other resin layer, when stress (stress generated by an impact, external stress, bending, or the like) is applied to a concave portion, the stress concentrates on a boundary between the end portion of the first opening portion in the concave portion, and the other resin layer, and thus interlayer peeling easily occurs. In contrast, according to this configuration, the end portion of the opposite surface VS2 of the first opening portion AP14A is bonded to the other resin layer (the resin layer 12d), so that the interlayer peeling due to the stress concentrated on the boundary between the end portion of the first opening portion AP14A in the concave portion and the other resin layer is significantly reduced or prevented.

Further, according to this configuration, the end portion (a portion to which a large number of scattered pieces are attached) of the one surface (the bottom surface of the resin layer 12d) VS1 of the first opening portion AP14B is not in contact with the other resin layer (the resin layer 11d), so that, in comparison with a case in which the end portion of the one surface VS1 of the first opening portion is in contact with other resin layers (see the multilayer resin substrates 104A and 104B), the interlayer peeling at the concave portion is further reduced or prevented.

Fifth Preferred Embodiment

In a fifth preferred embodiment of the present invention, an example of a multilayer resin substrate including an opening resin layer having a structure including a plurality of types of resin layers that are bonded to each other will be described.

Figure 13A:
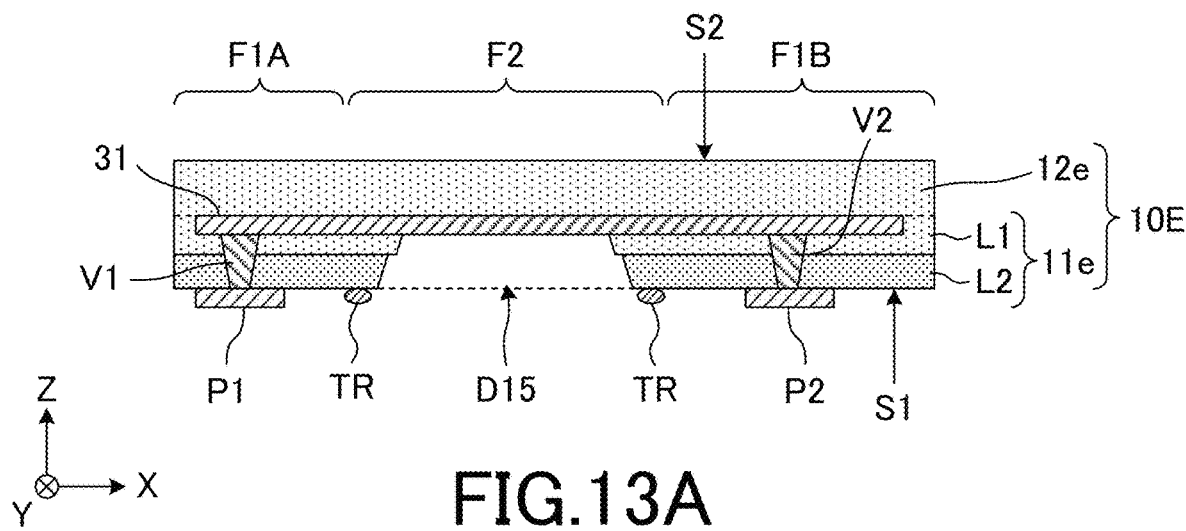
FIG. 13A is a cross-sectional view of a multilayer resin substrate 105 according to a fifth preferred embodiment of the present invention.
Figure 13B:
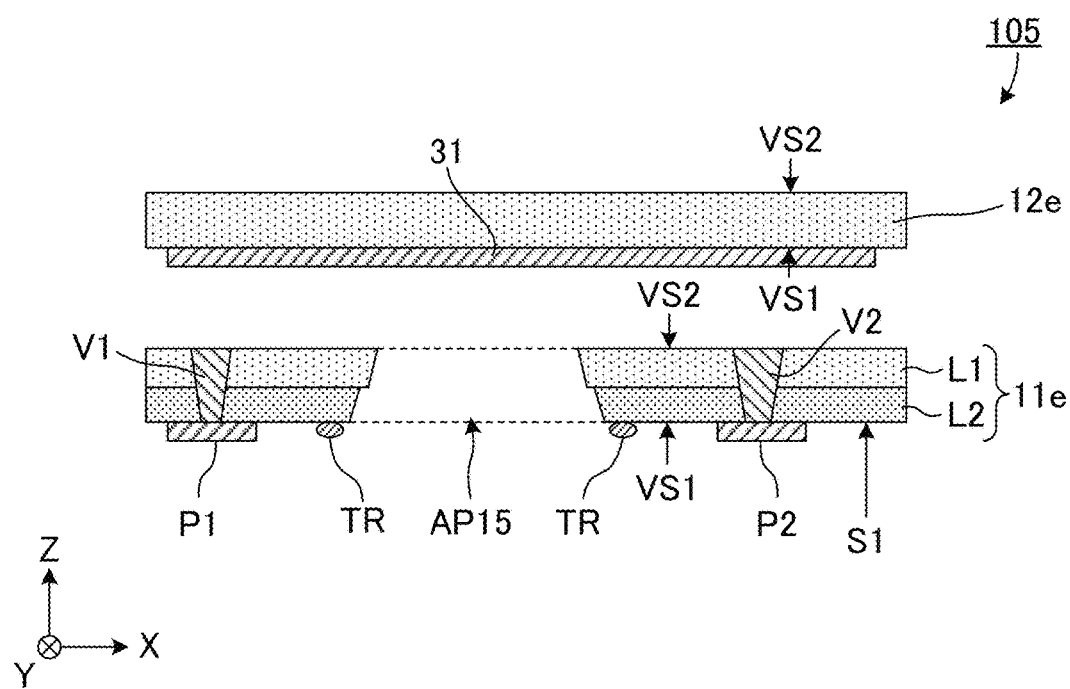
FIG. 13B is an exploded cross-sectional view of the multilayer resin substrate 105.

FIG. 13A is a cross-sectional view of a multilayer resin substrate 105 according to the fifth preferred embodiment of the present invention, and FIG. 13B is an exploded cross-sectional view of the multilayer resin substrate 105.

The multilayer resin substrate 105 is different from the multilayer resin substrate 101 according to the first preferred embodiment in that a base material 10E is provided. Other configurations of the multilayer resin substrate 105 are the same or substantially the same as the configurations of the multilayer resin substrate 101.

Hereinafter, the differences from the multilayer resin substrate 101 according to the first preferred embodiment will be described.

The base material 10E is a stacked body obtained by stacking a plurality of resin layers 11e and 12e that are made of a thermoplastic resin, for example. A concave portion D15 is provided in a first main surface S1 of the base material 10E. The resin layer 12e is the same or substantially the same as the resin layer 12a described in the first preferred embodiment.

In the present preferred embodiment, the resin layer 11e corresponds to an "opening resin layer".

The resin layer 11e includes a first resin layer L1 and a second resin layer L2 bonded to the first resin layer L1. The first resin layer L1 is positioned closer to the top surface (the opposite surface VS2 of the opening resin layer) of the resin layer 11e, and the second resin layer L2 is positioned closer to the bottom surface (the one surface VS1 of the opening resin layer) of the resin layer 11e. The second resin layer L2 is made of a resin material that is easier to evaporate by laser irradiation than a resin material of the first resin layer L1. The first resin layer L1 is a resin sheet made of a liquid crystal polymer (LCP), for example, as a main component. The second resin layer L2 is a resin sheet made of a fluororesin, such as polytetrafluoroethylene (PTFE), for example, as a main component.

In the present preferred embodiment, a relative dielectric constant ($\varepsilon 2$) of the second resin layer L2 is lower than a relative dielectric constant ($\varepsilon 1$) of the other resin layers (the resin layer 12e and the first resin layer L1) ($\varepsilon 1 > \varepsilon 2$). In addition, in the present preferred embodiment, a dielectric loss tangent (tan $\delta 2$) of the second resin layer L2 is smaller than a dielectric loss tangent (tan $\delta 1$) of the other resin layers (the resin layer 12e and the first resin layer L1) (tan $\delta 1 >$ tan $\delta 2$).

A first opening portion AP15 is provided in the resin layer 11e. The first opening portion AP15 is a rectangular or substantially rectangular through hole formed by a cutting process (laser irradiation, for example) from the bottom surface (the one surface VS1 of the opening resin layer) of the resin layer 11e. As described above, the second resin layer L2 positioned closer to the one surface VS1 of the resin layer 11e is easier to evaporate by laser irradiation than the first resin layer L1. Therefore, by the laser irradiation from the one surface VS1 of the opening resin layer, the end portion of the opposite surface VS2 of the second resin layer L2, when viewed in the Z-axis direction, is positioned closer to the outside than the end portion of the one surface VS1 of the first resin layer L1. In other words, in the first opening portion AP15, the end portion of the opposite surface VS2 of the second resin layer L2 is in contact with the first resin layer L1.

In a case in which the first resin layer positioned closer to the opposite surface VS2 of the opening resin layer is easier to evaporate by laser irradiation than the second resin layer, when laser irradiation is performed from the one surface VS1 of the opening resin layer, the end portion of the opposite surface (the top surface) VS2 of the second resin layer is brought into non-contact with the first resin layer. Then, when the end portion of the first resin layer is not bonded to the second resin layer in the first opening portion, and stress is applied to the concave portion (the first opening portion), the stress concentrates on a boundary between the first resin layer and the second resin layer in the concave portion, so that interlayer peeling easily occurs. In contrast, in the multilayer resin substrate 105, the end portion of the opposite surface VS2 of the second resin layer L2 in the first opening portion AP15 is bonded to the first resin layer L1. Therefore, the interlayer peeling due to the stress concentrated on the boundary between the end portion of the first resin layer L1 in the concave portion and the second resin layer L2 is significantly reduced or prevented.

In addition, in the present preferred embodiment, the opening resin layer (the resin layer 11e) includes the second resin layer L2 with better high frequency characteristics than the other resin layer (the resin layer 12e), so that a multilayer resin substrate with better in high frequency characteristics is able to be obtained. More specifically, a relative dielectric constant ($\varepsilon 2$) of the second resin layer L2 is lower than a relative dielectric constant ($\varepsilon 1$) of the other resin layers (the resin layer 12e and the first resin layer L1) ($\varepsilon 1 > \varepsilon 2$). Therefore, in a case in which a circuit having predetermined characteristics is provided in the multilayer resin substrate, without unnecessarily increasing capacitance between the conductor pattern (the conductor pattern 31, for example) provided on the base material 10E and the other conductor patterns, a line width of the conductor pattern is able to be increased and the conductor loss of the circuit is able to be reduced. In addition, in the case in which a circuit having predetermined characteristics is provided in the multilayer resin substrate, even when the line width of the conductor pattern is not required to be reduced, the resin layer 11e is able to be made thin and the thickness of the base material 10E is able to be reduced. Further, in the present preferred embodiment, a dielectric loss tangent (tan $\delta 2$) of the second resin layer L2 is smaller than a dielectric loss tangent (tan $\delta 1$) of the other resin layers (the resin layer 12e and the first resin layer L1) (tan $\delta 1 >$ tan $\delta 2$). Therefore, in comparison with a case in which a base material includes only resin layers with a relatively high dielectric loss tangent, a dielectric loss is able to be reduced.

The resin layer 11e according to the present preferred embodiment is manufactured by, for example, the following non-limiting manufacturing method.

First, a first resin layer L1 and a second resin layer L2 are prepared. The second resin layer L2 is made of a resin material that is easier to evaporate by laser irradiation than a resin material of the first resin layer L1. The first resin layer L1 is a resin sheet made of a liquid crystal polymer (LCP), for example, as a main component. The second resin layer L2 is a resin sheet made of a fluororesin, such as polytetrafluoroethylene (PTFE), for example, as a main component.

Subsequently, the first resin layer L1 and the second resin layer L2 are bonded to each other so that the first resin layer L1 is on the top surface (the opposite surface VS2 of the opening resin layer) and the second resin layer L2 is on the bottom surface (the one surface VS1 of the opening resin layer), and a resin layer 11e is obtained.

This step of forming a resin layer (an opening resin layer) 11e, before the first opening portion forming step, by bonding the first resin layer L1 and the second resin layer L2 such that the first resin layer L1 is closer to the opposite surface VS2 and the second resin layer L2 is closer to the one surface VS1 is an example of an "opening resin layer forming step".

It is to be noted that the above "opening resin layer forming step" may be performed before the conductor pattern forming step or may be performed after the conductor pattern forming step.

OTHER PREFERRED EMBODIMENTS

While each of the above-described preferred embodiments provides an example in which the multilayer resin substrate is a cable that connects two circuit substrates, the multilayer resin substrate of the present invention is not limited to such an example. The multilayer resin substrate may be a cable that connects a circuit substrate and other components or may be a surface mount device (an electronic component) to be surface mounted to one circuit substrate or the like. In addition, the multilayer resin substrate may be provided with a connector when necessary.

While each of the above-described preferred embodiments provides an example in which the base material is a rectangular or substantially rectangular resin flat plate, the present invention is not limited to such a configuration. The planar shape of the base material is able to be appropriately changed within the scope of producing the advantageous functions and effects of the present invention, and may be an L shape, a T shape, a Y shape, a U shape, or a crank shape, for example.

While each of the above-described preferred embodiments provides an example in which the planar shape of the concave portion is a rectangular or substantially rectangular groove provided in the entire or substantially the entire width direction (the Y-axis direction) of the base material, the present invention is not limited to such a configuration. The planar shape of the concave portion may be a polygon, a circle, an ellipse, an L shape, a T shape, a Y shape, a U shape, or a crank shape, for example. In addition, the concave portion is not limited to a groove provided in the entire or substantially the entire width direction of the base material and may be a cavity provided in the first main surface S1. Further, while each of the above-described preferred embodiments provides an example in which the concave portion is provided in order to make the second region F2 easier to bend, the concave portion of the present invention is not limited to this use. The concave portion may be a cavity provided in order to avoid, for example, a structure or other components that are disposed around the multilayer resin substrate.

While each of the above-described preferred embodiments provides an example in which the insulating base material is a rectangular or substantially rectangular flat plate, the present invention is not limited to such a configuration. The shape of the insulating base material is able to be appropriately changed within the scope of advantageous functions and effects of the preferred embodiments of the present invention. The planar shape of the insulating base material may be an L shape, a crank shape, a T shape, or a Y shape, for example. In addition, the bent shape of the multilayer resin substrate is not limited to the configuration described in each of the above preferred embodiments and is able to be appropriately changed within the scope of the functions and advantageous effects of the preferred embodiments of the present invention.

While each of the above-described preferred embodiments provides an example of the base material in which the first region F1A, the second region F2, and the first region F1B are disposed in this order, the present invention is not limited to such a configuration. The number and arrangement of the first region, and the number and arrangement of the second region are able to be appropriately changed.

While each of the above-described preferred embodiments provides examples of the base material provided by stacking two resin layers and the base material provided by stacking three resin layers, the base material of the present invention is not limited to such an example. The number of layers of the resin layers of the base material is able to be appropriately changed within the scope of the functions and advantageous effects of the preferred embodiments of the present invention. In addition, the opening resin layer is not limited to include one layer or two layers and may include three or more layers. Further, a protective film may be provided on the first main surface S1 or the second main surface S2.

While each of the above-described preferred embodiments provides an example in which the base material is a flat plate made of a thermoplastic resin, the present invention is not limited to such a configuration. The base material may be a flat plate of a thermosetting resin, for example. It is to be noted that, as described in the fifth preferred embodiment, the base material is not limited to a material made of the same material and may be a composite of different resin materials.

In addition, the configuration of the circuit provided in the multilayer resin substrate is not limited to the configuration described in the above preferred embodiments and is able to be appropriately changed within the scope of the functions and advantageous effects of the preferred embodiments of the present invention. For example, a coil defined by a conductor pattern, a capacitor defined by a conductor pattern, or a frequency filter such as various filters (a low-pass filter, a high-pass filter, a band-pass filter, a band-elimination filter) may be provided in the circuit provided in the multilayer resin substrate. In addition, for example, other various transmission lines (such as a strip line, a microstrip line, a coplanar line, or the like) may be provided on the multilayer resin substrate. Further, various electronic components such as a chip component, for example, may be mounted on or embedded in the multilayer resin substrate.

While each of the above-described preferred embodiments is a non-limiting example in which the rectangular electrodes P1 and P2 are provided on the first main surface S1 of the base material, the present invention is not limited to such a configuration. The shape, number, and arrangement of the electrodes are able to be appropriately changed within the scope of the functions and advantageous effects of the preferred embodiments of the present invention. The planar shape of the electrode may be a polygon, a circle, an ellipse, an arc, a ring, an L shape, a U shape, a T shape, a Y shape, or a crank shape, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer resin substrate comprising:
a base material including:
a first resin layer including:
a first surface; and
a second surface opposed to the first surface; and
a second resin layer including:
a third surface; and
a fourth surface opposed to the third surface;
a first conductor pattern on the first surface of the first resin layer;
a second conductor pattern between the second surface of the first resin layer and the third surface of the second resin layer;
an interlayer connection conductor in at least the first resin layer;
a first opening portion in the first resin layer; and
a second opening portion in the first resin layer; wherein
the first resin layer and the second resin layer are stacked on each other in a stacking direction;
the base material includes a fifth surface including a concave portion;
the fifth surface includes the first surface and is located on an outermost surface of the base material;
the concave portion includes the first opening portion;
the first opening portion is located on each of the first surface and the second surface;
an area of the first opening portion on the first surface is larger than an area of the first opening portion on the second surface, when viewed in the stacking direction;
the interlayer connection conductor is provided by a metal material in the second opening portion;
the second opening portion is located on each of the first surface and the second surface;
an area of the second opening portion on the first surface is smaller than an area of the second opening portion on the second surface, when viewed in the stacking direction;
the first opening portion includes an end portion on the first surface; and
the end portion is not in contact with the first conductor pattern.

2. The multilayer resin substrate according to claim 1, wherein the interlayer connection conductor includes:
a plated via in the second opening portion;
a conductive bonding material to be connected to the first conductor pattern; and
an alloy layer between the plated via and the conductive bonding material.

3. The multilayer resin substrate according to claim 1, wherein
the outermost surface of the base material includes a first main surface and a second main surface opposite to the first main surface;
the fifth surface is located on the first main surface;
the first resin layer includes a plurality of first resin layers;
the first opening portion includes a plurality of first opening portions;
the plurality of first resin layers are continuously stacked in the stacking direction; and
of two of the first opening portions adjacent to each other in the stacking direction, an end portion of the opposite surface of one of the two of the first opening portions closer to the first main surface, when viewed in the stacking direction, is positioned farther outside than an end portion of the one surface of another of the two of the first opening portions disposed closer to the second main surface.

4. The multilayer resin substrate according to claim 1, wherein
the first resin layer includes:
a third resin layer closer to the first surface; and
a fourth resin layer bonded to the third resin layer and closer to the second surface; and
the fourth resin layer is made of a resin material that is easier to evaporate by laser irradiation than a resin material of the third resin layer.

5. The multilayer resin substrate according to claim 1, wherein the second resin layer is made of a thermoplastic resin.

6. The multilayer resin substrate according to claim 1, wherein each of the first resin layer and the second resin layer is made of a liquid crystal polymer or a polyether ether ketone as a main component.

7. The multilayer resin substrate according to claim 1, wherein the first opening portion has a truncated conical shape.

8. The multilayer resin substrate according to claim 1, wherein the interlayer connection conductor has a truncated conical shape.

9. The multilayer resin substrate according to claim 1, wherein the conductor pattern is on the third surface of the second resin layer.

10. The multilayer resin substrate according to claim 1, wherein the first opening portion includes no interlayer connection conductor.

* * * * *